(12) United States Patent
Kwon

(10) Patent No.: US 8,339,845 B2
(45) Date of Patent: Dec. 25, 2012

(54) FLASH MEMORY DEVICE, PROGRAMMING METHOD AND MEMORY SYSTEM

(75) Inventor: Oh Suk Kwon, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 243 days.

(21) Appl. No.: 12/719,189

(22) Filed: Mar. 8, 2010

(65) Prior Publication Data

US 2010/0246259 A1    Sep. 30, 2010

(30) Foreign Application Priority Data

Mar. 25, 2009 (KR) .................. 10-2009-0025332

(51) Int. Cl.
*G11C 16/04*  (2006.01)
(52) U.S. Cl. ......... 365/185.03; 365/185.18; 365/185.17; 365/185.19
(58) Field of Classification Search ............. 365/185.03, 365/185.18, 185.17, 185.19
See application file for complete search history.

(56) References Cited

U.S. PATENT DOCUMENTS

| | | | |
|---|---|---|---|
| 7,286,408 B1* | 10/2007 | Higashitani | 365/185.19 |
| 8,010,768 B2* | 8/2011 | Chen et al. | 711/170 |
| 2007/0025152 A1* | 2/2007 | Futatsuyama | 365/185.17 |
| 2010/0202215 A1* | 8/2010 | Oh et al. | 365/185.23 |

FOREIGN PATENT DOCUMENTS

| | | | |
|---|---|---|---|
| KR | 1020050109835 A | | 11/2005 |
| KR | 1020060107697 A | | 10/2006 |
| KR | 1020060108324 A | | 10/2006 |
| KR | 1020080095419 A | | 10/2008 |

* cited by examiner

*Primary Examiner* — Van Thu Nguyen
*Assistant Examiner* — Hai Pham
(74) *Attorney, Agent, or Firm* — Volentine & Whitt, PLLC

(57) ABSTRACT

Provided is a programming method in a flash memory device. The programming method applies a first pass voltage to a selection word line and a non-selection word line, applies a local voltage to the non-selection word line, applies a second pass voltage to the selection word line, and applies a programming voltage to the selection word line.

20 Claims, 21 Drawing Sheets

FLASH MEMORY DEVICE, PROGRAMMING METHOD AND MEMORY SYSTEM

CROSS-REFERENCE TO RELATED APPLICATIONS

This U.S. non-provisional patent application claims priority under 35 U.S.C. §119 to Korean Patent Application No. 10-2009-0025332, filed on Mar. 25, 2009, the subject matter of which is hereby incorporated by reference.

BACKGROUND

The present disclosure relates to semiconductor memory devices, and more particularly, to flash memory devices, as well as related programming methods and memory systems.

Semiconductor memory devices are commonly used in a great variety of host devices to store data. Semiconductor memory devices may be generally classified as volatile and nonvolatile memory devices.

Volatile memory devices do not retain stored data in the absence of applied power, and include the Static Random Access Memory (SRAM), Dynamic Random Access Memory (DRAM) and Synchronous Dynamic Random Access Memory (SDRAM).

Nonvolatile memory devices are capable of retaining stored data in the absence of applied power and include the Read-Only Memory (ROM), Programmable Read Only Memory (PROM), Erasable Programmable Read Only Memory (EPROM), Electrical Erasable Programmable Read Only Memory (EEPROM), Phase-change Random Access Memory (PRAM), Magnetoresistive Random Access Memory (MRAM), Resistive Random Access Memory (RRAM), and Ferroelectric Random Access Memory (FRAM).

Flash memory is a particular form of EEPROM and may be further classified as NOR type or NAND type.

SUMMARY

Certain embodiments of the inventive concept provide a flash memory device having improved boosting efficiency, and/or decreased stress caused by the application of a pass voltage. Certain embodiments of the inventive concept also provide a flash memory device capable of preventing soft programming errors that may arise from the phenomenon know as Gate Induced Drain Leakage or "GIDL".

Embodiments of the inventive concept provide a programming method in a flash memory device that includes: applying a first pass voltage to a selection word line and a non-selection word line; applying a local voltage to the non-selection word line; applying a second pass voltage to the selection word line; and applying a programming voltage to the selection word line.

In some embodiments, applying the local voltage to the non-selection word line and applying the second pass voltage to the selection word line may be performed at the same time.

In other embodiments, a level of the second pass voltage may be higher than a level of the first pass voltage.

In still other embodiments, applying the first pass voltage to the selection word line and the non-selection word line may include applying the first pass voltage to a plurality of word lines between the first and second selection lines.

In even other embodiments, the selection word line may be disposed between the non-selection word line and the second selection line, and applying the second pass voltage to the selection word line may include applying the second pass voltage to a plurality of word lines between the non-selection word line and the second selection line.

In yet other embodiments, the first pass voltage may be applied to the non-selection word line and the first selection line, when the second pass voltage is applied to the selection word line.

In further embodiments, applying the first pass voltage to the selection word line and the non-selection word line may include: applying the first pass voltage to the selection word line, and a plurality of word lines between the selection word line and the first selection line; and applying a ground voltage to a plurality of word lines between the selection word line and the second selection line.

In still further embodiments, the non-selection word line may be disposed between the first selection line and the selection word line, and applying the second pass voltage to the selection word line may include applying the second pass voltage to a plurality of word lines between the non-selection word line and the second selection line.

In even further embodiments, the first pass voltage may be applied to the non-selection word line and the first selection line, when the second pass voltage is applied to the selection word line.

In yet further embodiments, applying the first pass voltage to the selection word line and the non-selection word line may include: applying the first pass voltage to the selection word line and the word lines between the selection word line and the first selection line and applying the ground voltage to the word lines between the selection word line and the second selection line may be performed at the same time.

In yet further embodiments, a plurality of memory cells which are connected to a first word line may be programmed prior to a plurality of memory cells which are connected to a second word line which is disposed between the first word line and the second selection line.

In yet further embodiments, applying the first pass voltage to the selection word line and the non-selection word line may include: applying the first pass voltage to a plurality of word lines between the selection word line and the first selection line, the selection word line, and a word line group including at least one word line which is disposed between the selection word line and the second selection line and is adjacent to the selection word line; and applying a ground voltage to a plurality of word lines between the word line group and the second selection line.

In yet further embodiments, the flash memory device may store a plurality of bits per cell, and a plurality of memory cells which are connected to the at least one word line of the word line group may pre-store at least one bit per cell.

In yet further embodiments, the non-selection word line may be disposed between the first selection line and the selection word line, and applying the second pass voltage to the selection word line may include applying the second pass voltage to a plurality of word lines between the non-selection word line and the second selection line.

In yet further embodiments, a least significant page of a first word line may be programmed prior to a least significant page of a second word line which is disposed between the first word line and the second selection line.

In yet further embodiments, the least significant page of the second word line may be programmed prior to a most significant page of the first word line.

In other embodiments of the inventive concept, a flash memory device includes: a memory cell array; a bias circuit configured to generate voltages applied to the memory cell array during a programming operation; and control logic configured to control operation of the bias circuit, wherein the control logic is configured to control application of a first pass voltage to a selection word line and non-selection word line of the memory cell array, application of a local voltage to the non-selection word line, application of a second pass voltage to the selection word line and application of a programming voltage to the selection word line.

In still other embodiments of the inventive concept, a memory system includes: a flash memory device; and a controller controlling the flash memory device, wherein the flash memory device comprises a memory cell array; a bias circuit configured to generate voltages applied to the memory cell array during a programming operation; and control logic configured to control operation of the bias circuit, wherein the control logic is configured to control application of a first pass voltage to a selection word line and non-selection word line of the memory cell array, application of a local voltage to the non-selection word line, application of a second pass voltage to the selection word line and application of a programming voltage to the selection word line.

In some embodiments, the flash memory device and the controller may form a semiconductor disk/drive (SSD, solid state disk/drive).

In other embodiments, the flash memory device and the controller may form a memory card.

BRIEF DESCRIPTION OF THE DRAWINGS

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION OF THE EMBODIMENTS

Embodiments of the inventive concept will be described below in more detail with reference to the accompanying drawings. The inventive concept may, however, be embodied in different forms and should not be construed as being limited to only the illustrated embodiments. Rather, these embodiments are presented as teaching examples.

A programming method executed in a flash memory device according to an embodiment of the inventive concept generally comprises; applying a first pass voltage to a selection word line and a non-selection word line, applying a local voltage to the non-selection word line, applying a second pass voltage to the selection word line, and then applying a programming voltage to the selection word line.

A flash memory device according to one embodiment of the inventive concept comprises a memory cell array, a bias circuit configured to generate certain bias voltages applied during a programming operation executed in relation to the memory cell array, and a control logic. The control logic circuit is configured to control the operation of the bias circuit, as well as the application of a first pass voltage to a selection word line and non-selection word line within the memory cell array, the application of a local voltage to the non-selection word line, the application of a second pass voltage to the selection word line, and the application of a programming voltage to the selection word line.

A memory system according to an embodiment of the inventive concept includes the foregoing flash memory device as well as a controller configured to control the general operation of the flash memory device Hereafter certain embodiments of the inventive concept will be described in some additional detail with reference to the accompanying drawings.

Figure 1:
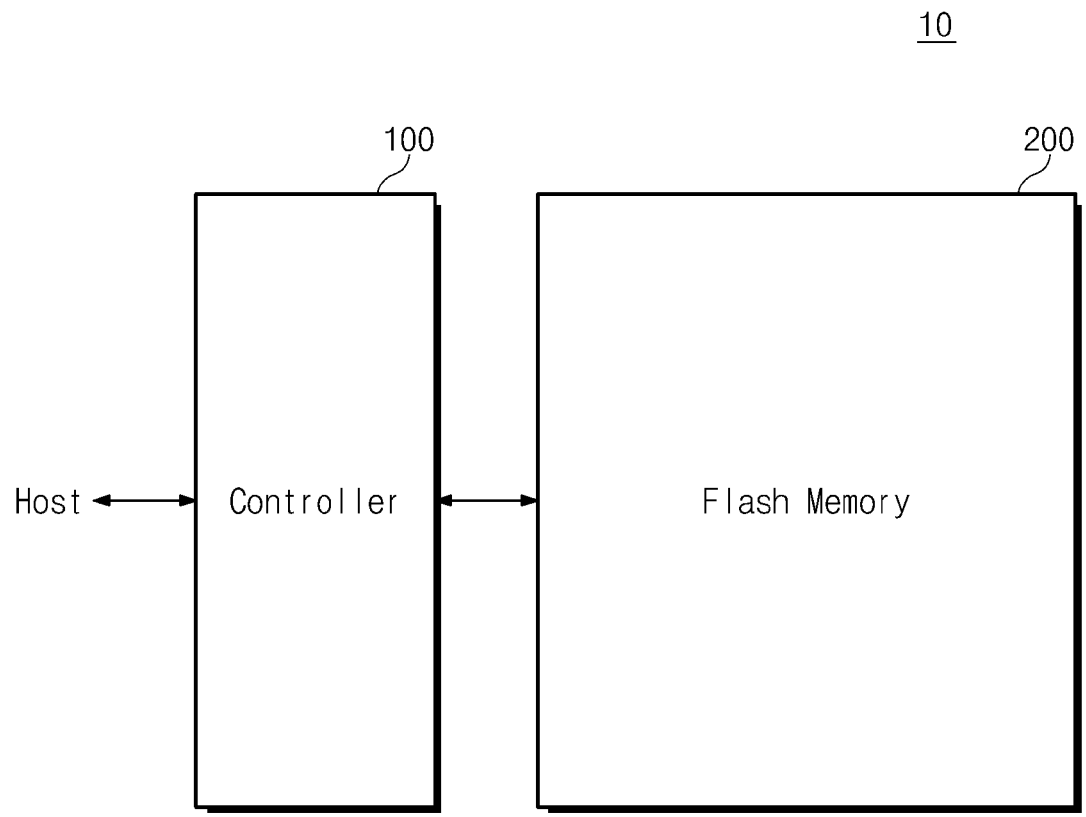
FIG. 1 is a block diagram illustrating a memory system according to an embodiment of the inventive concept.

FIG. 1 is a block diagram illustrating a memory system 10 according to an embodiment of the inventive concept. The memory system 10 generally comprises a controller 100 and a flash memory device 200.

The controller 100 is connected between a host device and the flash memory device 200. In its general operation, the controller 100 transfers write data received from the host and to be stored in the flash memory device 200 and read data retrieved from the flash memory device 200 and transferred to the host. The controller 100 may include certain conventionally understood components, such as RAM, a processing unit, a host interface and a memory interface. The RAM may be used in conjunction with the operation of the processing unit, and the processing unit will be configured to control the overall operation of the controller 100.

The host interface may operate in relation to one or more conventionally understood data transfer protocol(s) capable of exchanging data between the host and the controller 100. For example, the controller 100 may control the exchange of data with the host using one of more of interface protocols including (e.g.,) USB, MMC, PCI-E, Advanced Technology Attachment (ATA), Serial-ATA, Parallel-ATA, SCSI, ESDI and Integrated Drive Electronics (IDE).

The memory interface interfaces with the flash memory device 200. In certain embodiments of the inventive concept, the controller 100 may additionally include a conventionally understood error detection/correction (ECC) block. The ECC block may be used to detect and/or correct one or more errors in the read data retrieved the flash memory device 200.

The flash memory device 200 is assumed to include a memory cell array of conventional configuration capable of storing data. As is conventionally understood, the memory cell array will be accessed via a read/write circuit, one or more address decoder(s) configured to decode an address received from the controller 100 (or some other external source), and control logic configured to control the overall operation of the flash memory device 200. The flash memory device 200 according to an embodiment of the inventive concept will be described hereafter in some additional detail with reference to FIG. 2.

In certain embodiments of the inventive concept, the controller 100 and the flash memory device 200 may be integrated into a single semiconductor device. As an example, the controller 100 and the flash memory device 200 may be integrated as one semiconductor device to configure a memory card. For example, the controller 100 and the flash memory device 200 may be integrated as one semiconductor device to configure a PC card (for example, PCMCIA), a compact flash card (CF), a smart media card (SM/SMC), a memory stick, a multimedia card (for example, MMC, RS-MMC and MMCmicro), an SD card (for example, SD, miniSD and microSD), and a universal flash memory device (for example, UFS).

As another example, the controller 100 and the flash memory device 200 may be integrated as one semiconductor device to configure a semiconductor disk/drive or solid state disk/drive (SSD). When the memory system 10 is integrated as a SSD, the operating speed of the host connected to the memory system 10 may be markedly improved.

As another example, the memory system 10 may be incorporated within a computer, portable computer, UMPC, workstation, net-book, PDA, web tablet, wireless phone, mobile phone, smart phone, digital camera, digital audio recorder/player, digital picture/video recorder/payer, or similar device capable of communicating data via in wireless environment. In similar vein, the memory system 10 may be incorporated within various electronic devices configured to operate in connection with a home network, a computer network, or a telematics network. Further, the memory system 10 may be incorporated within a computational system as a SSD or memory card.

As another example, the flash memory device 200 or the memory system 10 may be mounted as various types of packages. For example, the flash memory device 200 or the memory system 10 may be packaged in a package type such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP), thereby being mounted.

In the detailed embodiments described hereafter, it is assumed that the exemplary semiconductor memory device is a NAND flash memory device. Those skilled in the art will recognize that this is merely one particular example of many different types of nonvolatile memory devices that may be used within various embodiments of the invention, including without limitation ROM, PROM, EPROM, EEPROM, flash memory device, PRAM, MRAM, RRAM and FRAM.

Figure 2:
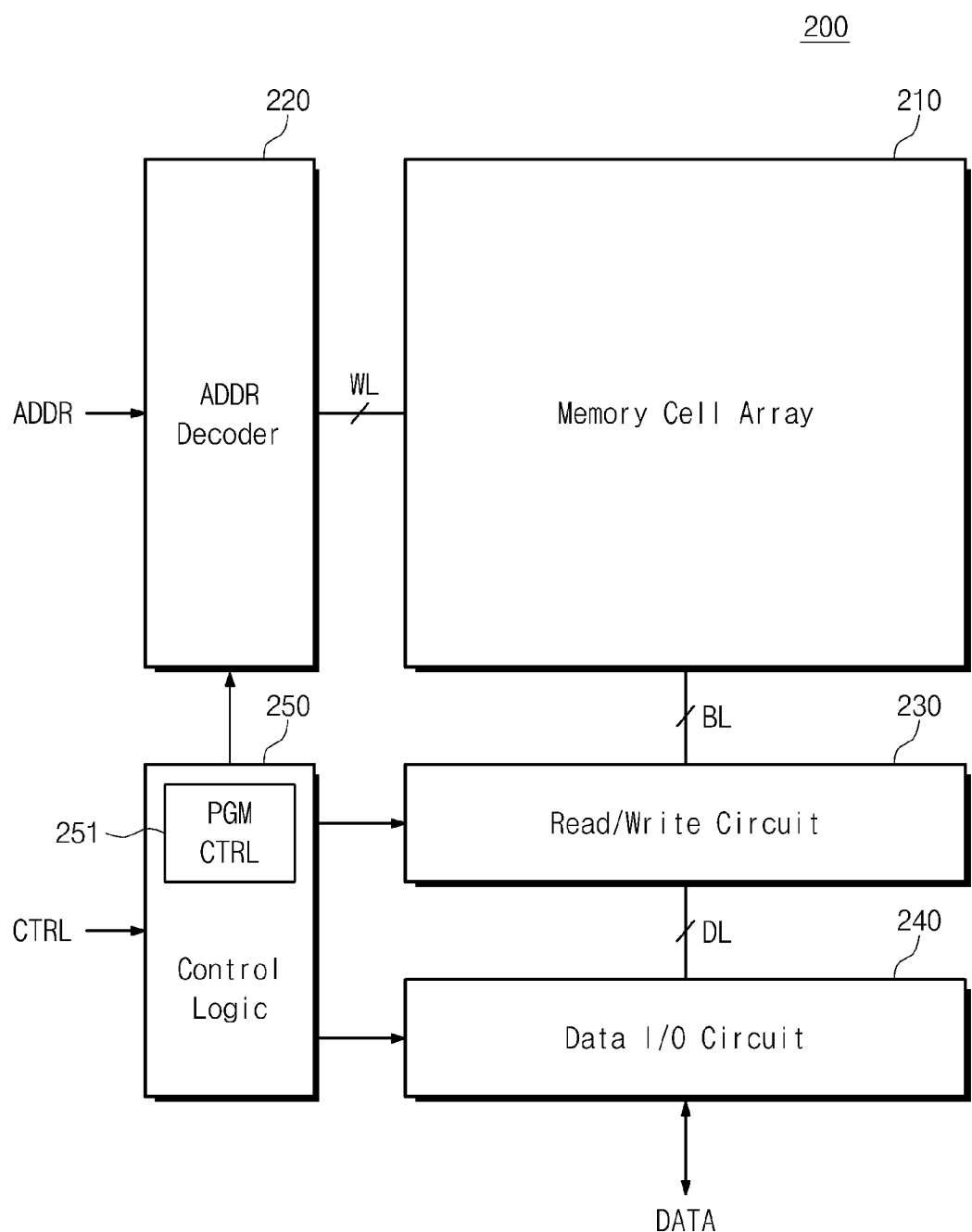
FIG. 2 is a block diagram illustrating a flash memory device in FIG. 1.

FIG. 2 is a block diagram further illustrating the flash memory device 200 in FIG. 1. The flash memory device 200 generally comprises a memory cell array 210, an address decoder 220, a read/write circuit 230, a data input/output (I/O) circuit 240, and a control logic 250.

The memory cell array 210 is connected to the address decoder 220 through word lines WL, and is connected to the read/write circuit 230 through bit lines BL. The memory cell array 210 includes a plurality of memory cells. The memory cells are connected to the word lines WL and the bit lines BL. As an example, each of the memory cells of the memory cell array 210 may store at least one bit. The memory cell array 210 will be described below in some additional detail with reference to FIG. 3.

The address decoder 220 is connected to the memory cell array 210 through the word lines WL. The address decoder 220 operates according to the control of the control logic 250. The address decoder 220 receives an address ADDR from the outside. As an example, the address ADDR may be transferred from the controller 100 in FIG. 1.

The address decoder 220 decodes the row address of the transferred address ADDR to select the word lines WL. Voltages for a programming operation, voltages for a read operation or voltages for an erase operation may be biased to the memory cell array 210 through the selected word lines WL. For example, the address decoder 220 may bias the word lines WL of the memory cell array 210.

The address decoder 220 decodes the column address of the transferred address ADDR to transfer the decoded address to the read/write circuit 230. As an example, the address decoder 220 may include elements such as a row decoder, a column decoder and an address buffer.

The read/write circuit 230 is connected to the memory cell array 210 through the bit lines BL, and is connected to the data input/output circuit 240 through data lines DL. The read/write circuit 230 operates according to the control of the control logic 250. The read/write circuit 230 selects the bit lines BL in response to the decoded column address that is transferred from the address decoder 220. Voltages for a programming operation, a read operation or an erase operation are biased to the selected bit lines. For example, the read/write circuit 230 biases the bit lines BL.

As an example, the read/write circuit 230 may store data, which are transferred from the data input/output circuit 240, in the memory cell array 210. As another example, the read/write circuit 230 may transfer data, which are read from the memory cell array 210, to the data input/output circuit 240. As another example, the read/write circuit 230 may store data, which are read from the first storage region of the memory cell array 210, in the second storage region of the memory cell array 210. For example, the read/write circuit 230 may be used to perform a copy-back operation.

As an example, the read/write circuit 230 may include elements such as a page buffer and a column selection circuit. As another example, the read/write circuit 230 may include elements such as a sense amplifier, a writing driver and a column selection circuit.

The data input/output circuit 240 is connected to the read/write circuit 230 through the data lines DL. The data input/output circuit 240 operates according to the control of the control logic 250. The data input/output circuit 240 exchanges data DATA with the outside. As an example, the data input/output circuit 240 may exchange data with the controller 100 in FIG. 1. The data DATA transferred from the outside may be transferred to the read/write circuit 230 through the data lines DL. The data DATA transferred from the read/write circuit 230 may be outputted to the outside. As an example, the data input/output circuit 240 may include elements such as a data buffer.

The control logic 250 is connected to the address decoder 220, the read/write circuit 230 and the data input/output circuit 240. The control logic 250 controls the overall operation of the flash memory device 200. The control logic 250 operates in response to a control signal CTRL that is transferred from the outside. As an example, the control signal CRT may be transferred from the controller 100 in FIG. 1. The control logic 250 includes a program controller 251 (PGM CTRL). The program controller 251 controls a programming operation for the memory cell array 210. The operation of the program controller 251 will be described below in some additional detail with reference to FIG. 5.

In FIG. 2, the program controller 251 is illustrated as an element within the control logic 250. However, the program controller 251 is not limited to this form of implementation. The program controller 251 may be configured as a functional block independently implemented in relation to the control logic 250.

As an example, the program controller 251 may be implemented with a digital circuit, an analog circuit or hardware in which the digital circuit and the analog circuit are coupled. As another example, the program controller 251 may be implemented in software that is driven in the flash memory device 200. As another example, the program controller 251 may be implemented in a type where hardware and software are combined.

Figure 3:
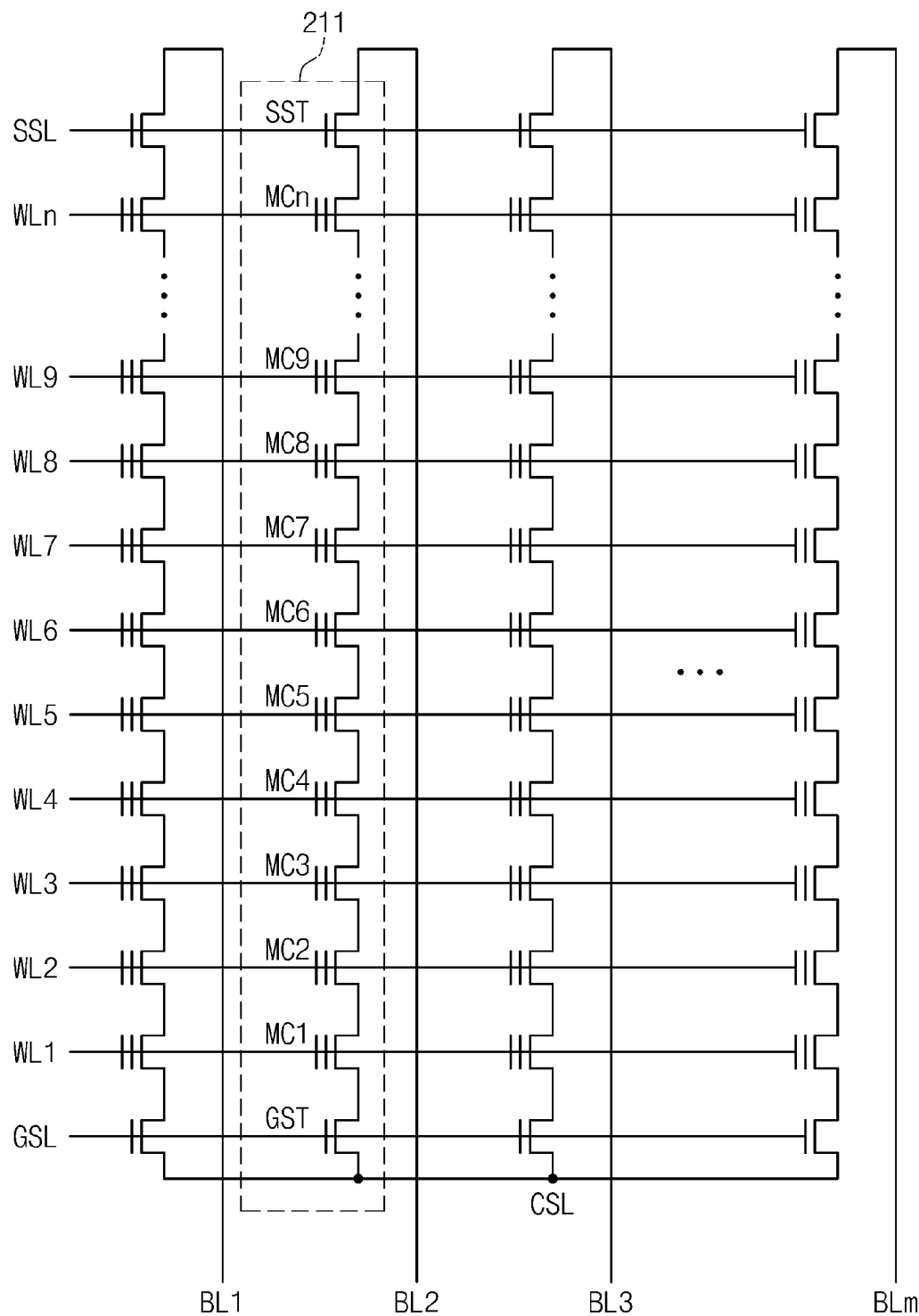
FIG. 3 is a circuit diagram illustrating a memory cell array in FIG. 2.

FIG. 3 is a circuit diagram illustrating a portion of the memory cell array 210 of FIG. 2. As an example, the memory cell array 210 may include a plurality of memory blocks. For conciseness, only a single memory block of the memory cell array 210 is illustrated in FIG. 3.

Referring to FIG. 3, a plurality of memory cells MC1 to MCn are connected in series to form a string structure. A string selection transistor SST is connected between the memory cells MC1 to MCn and a bit line BL2 corresponding to them. A ground selection transistor GST is connected between the memory cells MC1 to MCn and a common source line CSL. The string selection transistor SST, the memory cells MC1 to MCn and the ground selection transistor GST form a cell string 211.

The memory cell array 210 includes a plurality of cell strings. The gates of the string selection transistors SST of the plurality of cell strings are connected to a string selection line SSL. The gates of the ground selection transistors GST of the plurality of cell strings are connected to the ground selection line GSL. The control gates of the memory cells MC1 to MCn of the plurality of cell strings are connected to word lines WL1 to WLn corresponding to them. The word lines WL1 to WLn, the ground selection line GSL and the string selection line SSL are connected to the address decoder 220 of FIG. 2. The bit lines BL1 to BLm are connected to the read/write circuit 230 of FIG. 2.

Figure 4:
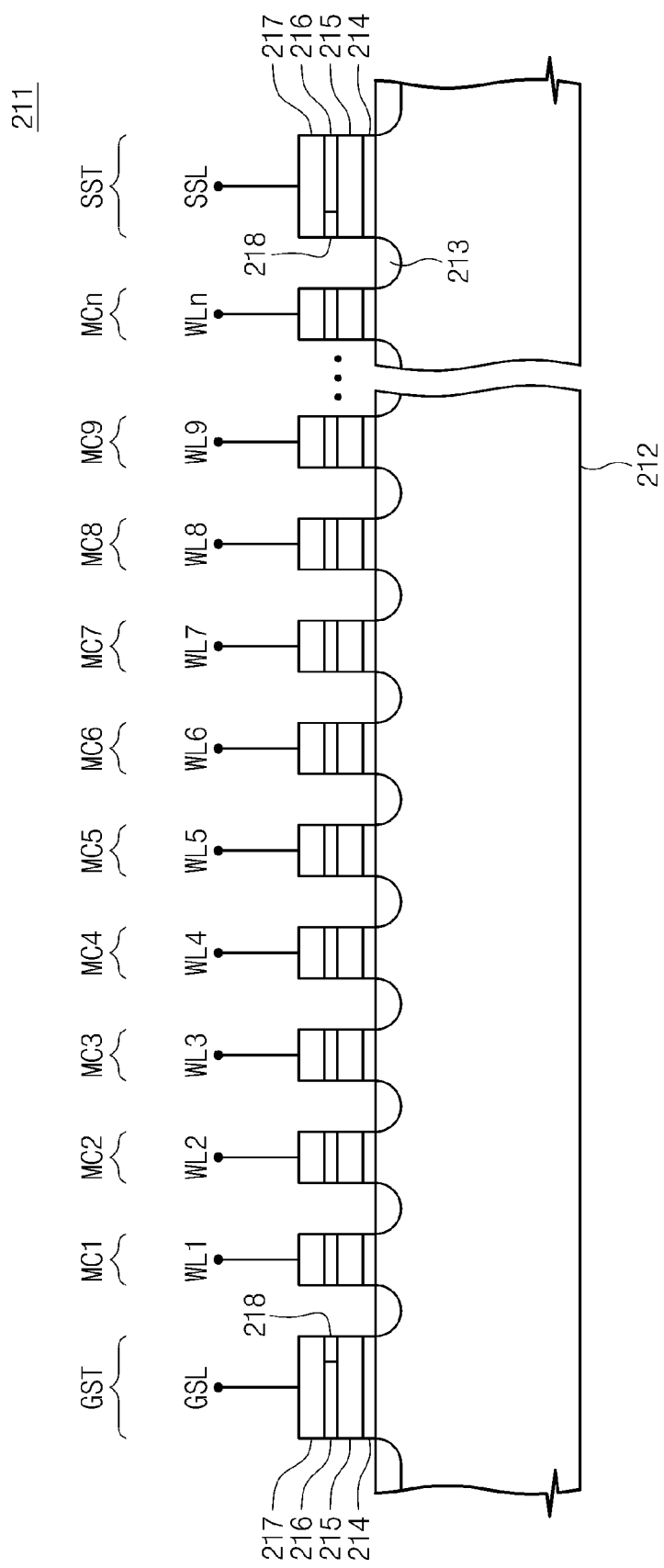
FIG. 4 is a cross-sectional view illustrating the cell string of the memory cell array in FIG. 3.

FIG. 4 is a cross-sectional view further illustrating the cell string 211 of the memory cell array 210 of FIG. 3.

Referring to FIG. 4, a source/drain region 213 is provided within a bulk region 212. As an example, the bulk region 212 may be a P-type well (p-well, or pocket p-well). For example, the source/drain region 213 may be an N-type well. The source/drain region 213 may be provided as the source region and drain region of the memory cells MC1 to MCn.

Gate structures are provided onto the bulk region 212. Each of the gate structures includes a tunnel dielectric layer 214, a charge trapping layer 215, a blocking dielectric layer 216, and a control gate 217.

A corresponding bit line BL2 (see FIG. 3) may be connected to the drain/source region of the string selection transistor SST. As an example, the bit line BL2 may include a conductor such as tungsten (W). The common source line CSL (see FIG. 3) may be connected to the source/drain region of the ground selection transistor GST. For example, the common source line CSL may include a conductor such as polysilicon.

In the tunnel dielectric layer 214, F-N tunneling from the channel region of the memory cells MC1 to MCn to the corresponding charge trapping layer 215 is formed. As an example, a carrier (for example, electron or hole) on the channel region of the memory cells MC1 to MCn is accumulated or trapped in the corresponding charge trapping layer 215 by electric field from the corresponding control gate 217. As an example, the tunnel dielectric layer 214 may include an insulator such as silicon oxide or silicon nitride.

As an example, the charge trapping layer 215 may include a conductor such as polysilicon. That is, the charge trapping layer 215 may be a floating gate for accumulating charges. As another example, the charge trapping layer 215 may include an insulator such as polysilicon oxide or silicon nitride. That is, the charge trapping layer 215 may be a charge trap for trapping charges.

The blocking dielectric layer 216 is provided for preventing the flow of charges between the charge trapping layer 215 and the control gate 217. As an example, the blocking dielectric layer 216 may include an insulator such as oxide/nitride/oxide (ONO). The control gate 217 receives a voltage through the word lines WL1 to WLn and the selection lines SSL and GSL. As an example, the control gate 217 may include a conductor such as polysilicon. As an example, the control gate 217 may be extended in the direction where it intersects with the bit lines BL1 to BLm to form the word lines WL1 to WLn and the selection lines SSL and GSL.

As an example, the charge trapping layer 215 and control gate 217 of the selection transistors SST and GST may be electrically connected through a via 218. That is, the selection transistors SST and GST may operate like an NMOS transistor. However, the charge trapping layer 215 and control gate 217 of the selection transistors SST and GST may be disconnected in electricity.

As an example, the width of the selection transistors SST and GST is illustrated greater than the width of the memory cells MC1 to MCn, but it is not limited thereto.

As an example, the gate structure of the selection transistors SST and GST and the memory cells MC1 to MCn is illustrated to include the tunnel dielectric layer 214, the charge trapping layer 215, the blocking dielectric layer 216 and the control gate 217, but it is not limited thereto. As an example, a side spacer that is provided to the side surface of a gate structure or a capping layer on the control gate 217 may be additionally provided.

Figure 5:
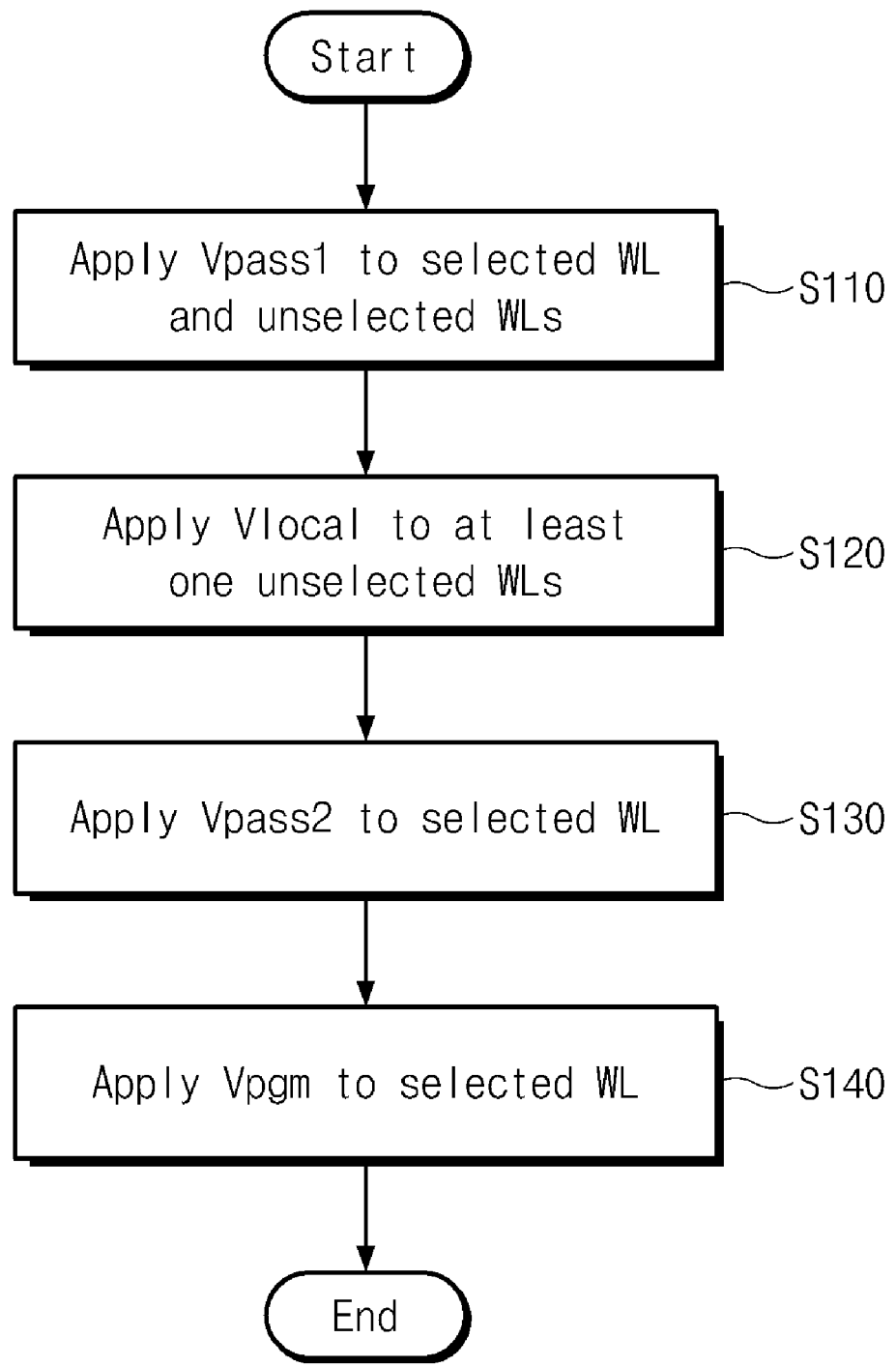
FIG. 5 is a flow chart summarizing the operation of a program controller in FIG. 2.

FIG. 5 is a flow chart summarizing in one embodiment of the inventive concept the operation of the program controller 251 of FIG. 2. For conciseness, it is assumed that the word line WL6 is a word line that has been "selected" for programming and programming is inhibited for the bit line BL2. That is, it is assumed that programming is inhibited in the cell string 211. In a programming operation, accordingly, a voltage Vcc is set up on the bit line BL2 and the channel of the cell string 211 is boosted.

Hereinafter, a second pass voltage Vpass2 is a voltage that allows programming to be inhibited by boosting the channel voltage of the memory cell. A first pass voltage Vpass1 is a voltage that has a level lower than the second pass voltage Vpass2. The first pass voltage Vpass1 is a voltage for forming and boosting the channel of a programming-inhibited memory cell. Whether programming is inhibited by boosting the channel voltage of the memory cell with the first pass voltage Vpass1 is not limited.

Referring collectively to FIGS. 2 and 5, the program controller 251 initially controls the application of the first pass voltage Vpass1 to the selected word line (i.e., the "selection word line", or WL6 in the illustrated example) as well as to the non-selected word line (i.e., the "non-selection word line", or WL3 in the illustrated example) (S110). For example, the address decoder 220 may transfer the first pass voltage Vpass1 to the selection word line WL6 and the non-selection word line WL3 according to the control of the program controller 251. Since the bit line BL2 is set up to a voltage Vcc, the channel of the cell string 211 is formed and boosted by the first pass voltage Vpass1.

The program controller 251 causes a channel to be formed in the cell string 211 with the first pass voltage Vpass1. The channel includes a channel region that corresponds to the selection word line WL6 and the non-selection word line WL3. As an example, the program controller 251 performs controlling to apply the first pass voltage Vpass1 to the word lines WL1 to WLn between the selection lines GSL and SSL. As another example, the program controller 251 controls the application of the first pass voltage Vpass1 to the selection word line WL6 and the word lines WL1 to WL6 between the selection word line WL6 and the ground selection line GSL.

Returning to FIG. 5, the program controller 251 then controls the application of a local voltage Vlocal to at least one non-selection word line WL3 (S120). The local voltage Vlocal is a voltage for disconnecting the channel of the cell string 211. In certain embodiments of the inventive concept, the local voltage Vlocal may have a higher level than ground voltage. For example, the local voltage Vlocal may have a lower level than a channel voltage that is boosted by the first pass voltage Vpass1. As an example, the address decoder 220 may transfer the local voltage Vlocal to the non-selection word line WL3 according to the control of the program controller 251.

The program controller 251 disconnects a channel that was formed by the first pass voltage Vpass1 by applying the local voltage Vlocal. Among channels that are disconnected and formed by the local voltage Vlocal, a channel that includes a channel region corresponding to the selection word line WL6 is called a selection channel. Among channels that are disconnected and formed by the local voltage Vlocal, channels that are disconnected from the channel region corresponding to the selection word line WL6 are called non-selection channels.

Then, the program controller 251 controls the application of a second pass voltage Vpass2 to the selection word line WL6 (S130). In certain embodiments of the inventive concept, the second pass voltage Vpass2 may have a higher level than the first pass voltage Vpass1. For example, the address decoder 220 transfers the second pass voltage Vpass2 to the selection word line WL6 according to the control of the program controller 251.

The program controller 251 boosts the voltage of the selection channel with the second pass voltage Vpass2. For example, the second pass voltage Vpass2 may be applied to word lines corresponding to the selection channel. For example, the voltage of word lines corresponding to the non-selection channels may be maintained as the first pass voltage Vpass1.

Then, the program controller 251 controls the application of a programming voltage Vpgm to the selection word line (S140). In certain embodiments of the inventive concept, the address decoder 220 transfers the programming voltage Vpgm to the selection word line WL6 under the control of the program controller 251. The voltage of a selection channel that includes a channel region corresponding to the selection word line WL6 has a level that is boosted by the first pass voltage Vpass1, the second pass voltage Vpass2 and the programming voltage Vpgm. Accordingly, programming is inhibited in the memory cell MC6 corresponding to the selection word line WL6.

As described above, the selection channel is boosted by application of the first pass voltage Vpass1, is then localized by application of the local voltage Vlocal, and is then boosted by application of the second pass voltage Vpass2 and the programming voltage Vpgm. Since the selection channel is boosted by the second pass voltage Vpass2 following localization, the overall boosting efficiency can be markedly improved.

Moreover, the first pass voltage Vpass1 is applied to the non-selection channel, but the second pass voltage Vpass2 is not applied to the non-selection channel. Accordingly, the stress caused by application of the pass voltage can be decreased.

The voltage of the non-selection channel is boosted by the first pass voltage Vpass1, but it is not boosted by the second pass voltage Vpass2. That is, the voltage of the non-selection channel is lower than that of the selection channel. Accordingly, Gate Induced Drain Leakage (GIDL) occurring between the non-selection channel and the memory cell to which the local voltage Vlocal is applied can be decreased, thereby reducing the likelihood of the memory cell to which the local voltage Vlocal is applied from being soft programmed by the GIDL.

Figure 6:
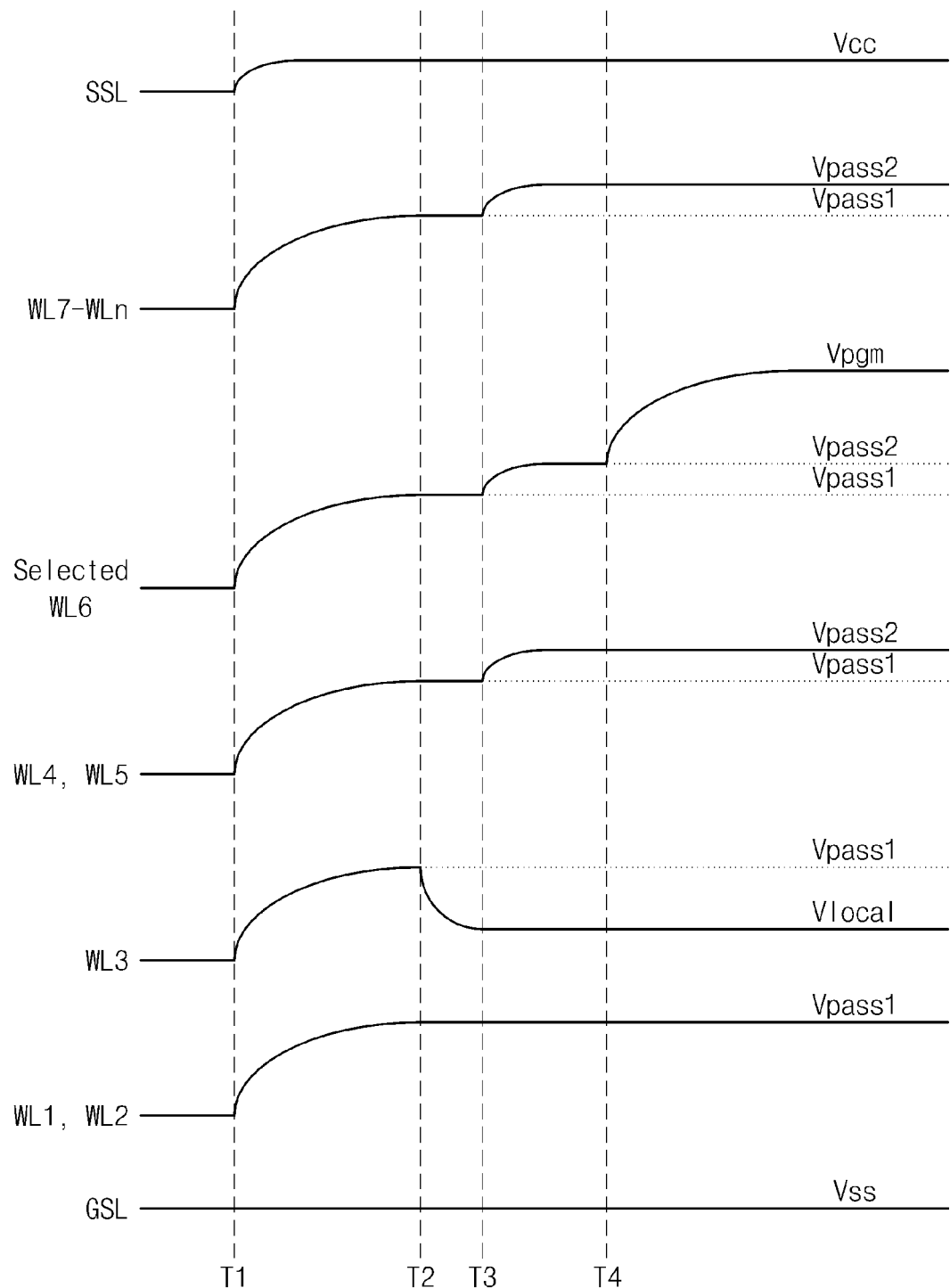
FIG. 6 is a timing diagram further describing the exemplary programming method summarized in FIG. 5.

FIG. 6 is a timing diagram further describing the exemplary programming method summarized in FIG. 5. FIGS. 7 through 10 are related cross-sectional diagram further illustrating the state of the channel for the cell string 211 as operated according to the timing diagram of FIG. 6.

Referring to FIG. 6, at a first time T1, the voltage Vcc is applied to the string selection line SSL, and the ground voltage Vss is applied to the ground selection line GSL. The first pass voltage Vpass1 is applied to the selection word line WL6 and the non-selection word line WL3. For example, the first pass voltage Vpass1 is applied to the word lines WL1 to WLn between the first and second selection lines GSL and SSL. Since the cell string 211 is one in which programming is inhibited, the voltage Vcc is set up onto the corresponding bit line BL2. That is, in the cell string 211, a channel is formed and boosted by the first pass voltage Vpass1. The channel that is formed by the application of the first pass voltage Vpass1 is illustrated in FIG. 7.

Figure 7:
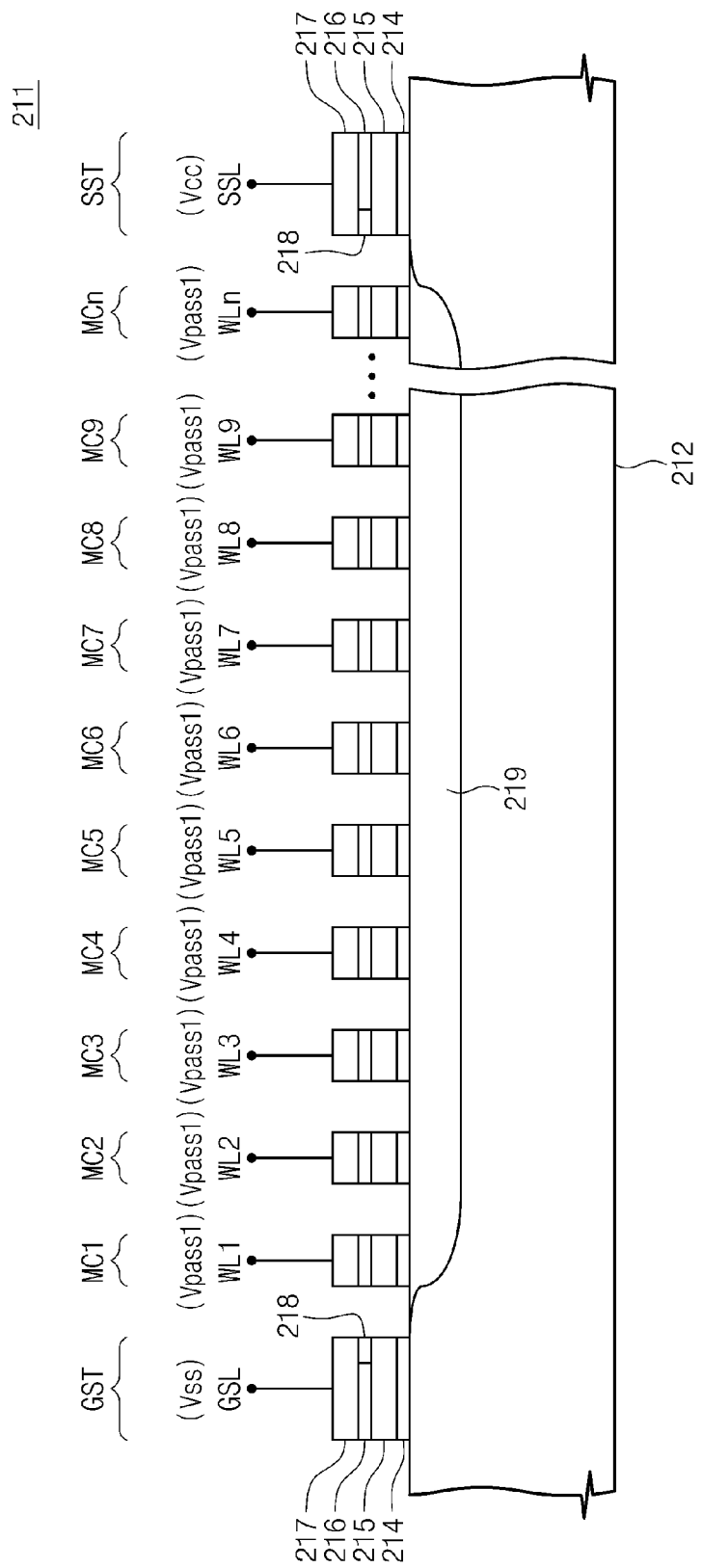
FIGS. 7 through 10 are diagrams illustrating the channel state of a channel of a cell string based on the timing diagram of FIG. 6.

In FIG. 7, for conciseness, the source/drain regions of the memory cells MC1 to MCn and the selection transistors SST and GST are omitted, and a channel 219 that is formed by the first pass voltage Vpass1 is illustrated. Referring to FIG. 7, the first pass voltage Vpass1 is biased to the word lines WL1 to WLn between the first and second selection lines GSL and SSL. Furthermore, the channel 219 is formed by the first pass voltage Vpass1. The voltage of the channel 219 may have a level that is boosted by the first pass voltage Vpass1.

Returning to FIG. 6, at a second time T2, the local voltage Vlocal is applied to the non-selection word line WL3. The local voltage Vlocal has a level sufficient to disconnect the channel 219 (see FIG. 7) formed by the application of the first pass voltage Vpass1. In one particular embodiment of the inventive concept, for example, the local voltage Vlocal has a higher level than the ground voltage Vss. That is, the local voltage Vlocal may have a level lower than the voltage of the channel as boosted by application of the first pass voltage Vpass1. The voltage of the channel 219 as boosted by the application of the first pass voltage Vpass1 may be the voltage of the source and drain region of the memory cell MC3. When the control gate voltage of the memory cell MC3 is lower than the voltage of the source and drain region, the memory cell MC3 is turned OFF. A state, in which the channel that is formed by the first pass voltage Vpass1 is disconnected by the local voltage Vlocal, is illustrated in FIG. 8.

Figure 8:
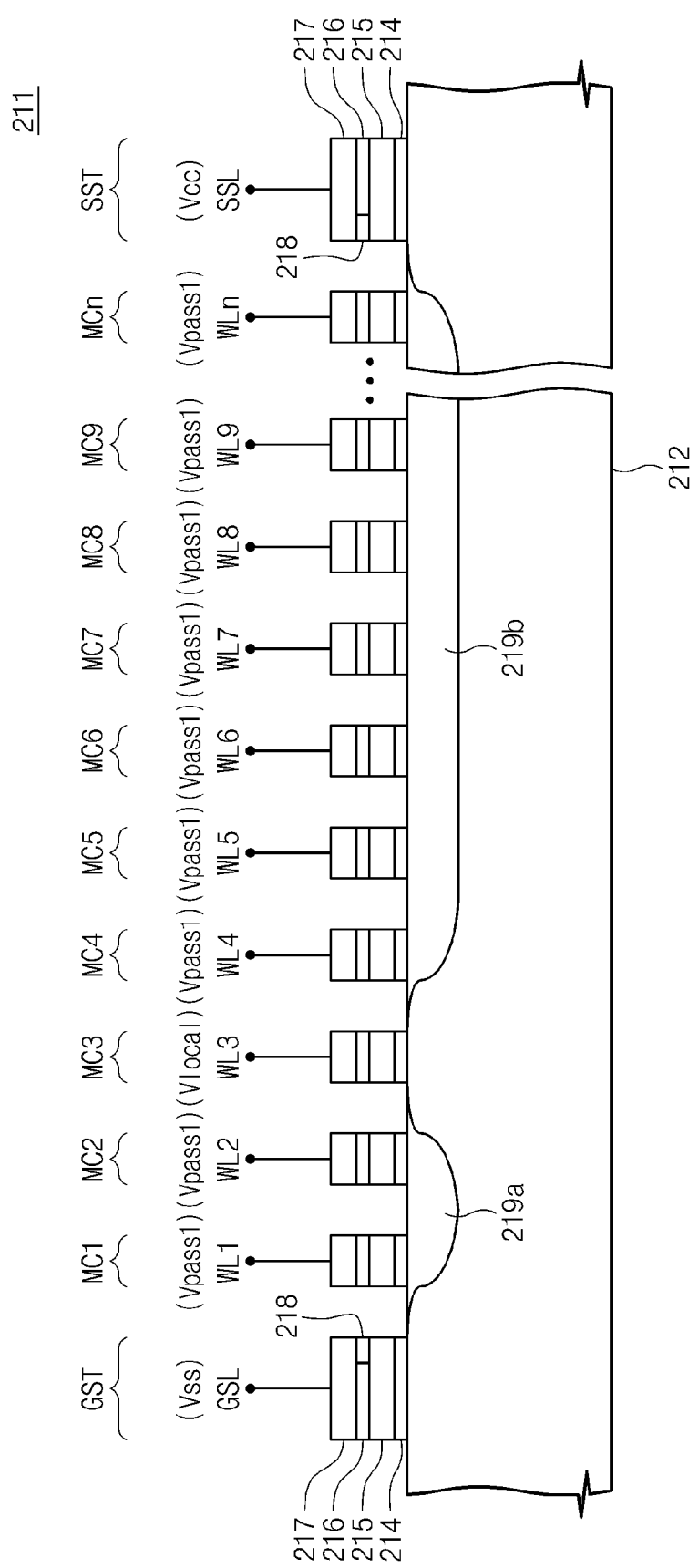

Referring to FIG. 8, the local voltage Vlocal is applied to the non-selection word line WL3. The channel that was formed by the application of the first pass voltage Vpass1 is now divided into a plurality of channels 219a and 219b around the non-selection word line WL3 to which the local voltage Vlocal is applied. Hence, the channel 219a is disconnected from a channel region corresponding to the selection word line WL6. That is, the channel 219a is a non-selection channel. The channel 219b includes a channel region corresponding to the selection word line WL6. That is, the channel 219b remains a selection channel.

Referring again to FIG. 6, at a third time T3, the second pass voltage Vpass2 is applied to the selection word line WL6. In one particular embodiment of the inventive concept, for example, the second pass voltage Vpass2 is applied to the word lines WL4 to WLn between the non-selection word line WL3 and the second selection line SSL. That is, the voltage of the word lines WL4 to WLn corresponding to the selection channel 219b as boosted by the application of the first pass voltage Vpass1 is additionally boosted by the application of the second pass voltage Vpass2. The selection channel 219b is boosted by the second pass voltage Vpass2 in a state where it is disconnected from the non-selection channel 219a. Furthermore, the non-selection channel 219a is not boosted by the application of the second pass voltage Vpass2.

Figure 9:
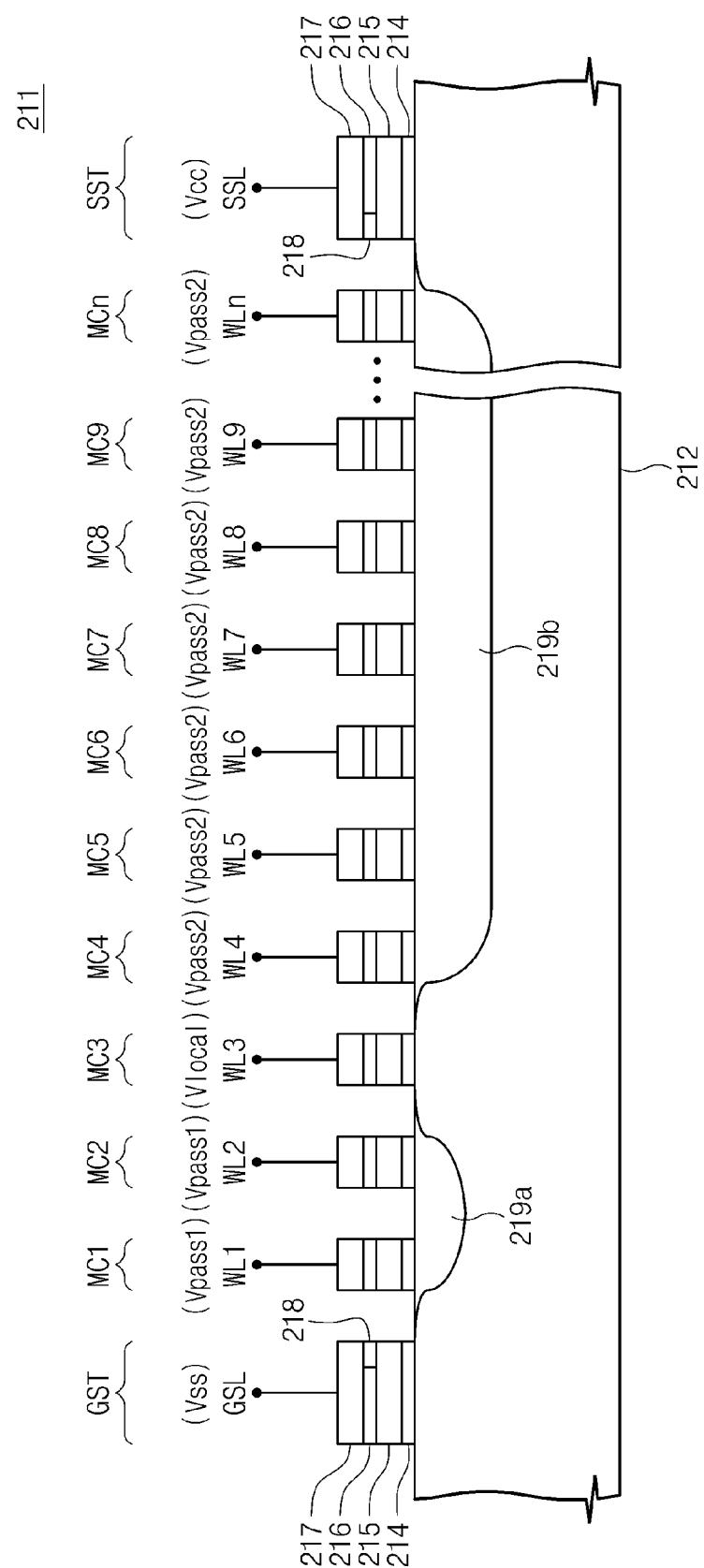

A state in which the selection channel 219b is boosted by the second pass voltage Vpass2 is illustrated in FIG. 9.

Referring to FIG. 9, the first pass voltage Vpass1 is applied to the word lines WL1 and WL2 corresponding to the non-selection channel 219a. The second pass voltage Vpass2 is applied to the word lines WL4 to WLn corresponding to the selection channel 219b. The voltage of the selection channel 219b is further boosted in correspondence with difference between the first pass voltage Vpass1 and the second pass voltage Vpass2. Moreover, since boosting is performed in the selection channel 219b that is localized, overall boosting efficiency can be markedly increased.

In order to prevent coupling, the memory cell array 210 (see FIG. 3) may be programmed according to a predetermined pattern. For example, in the memory cell array 210, data may be stored in order from memory cells (for example, including MC1) adjacent to the first selection line GSL to memory cells (for example, including MCn) adjacent to the second selection line SSL.

For example, when the word line WL6 is the selection word line, the memory cells (for example, MC1 to MC5) that are connected to the word lines WL1 to WL5 between the selection word line WL6 and the first selection line SSL may already store data. That is, the threshold voltage of the memory cells having a programmed state among the memory cells MC1 to MC5 may be lower than the threshold voltage of the memory cells having an erase state.

For example, when the word line WL6 is the selection word line, the memory cells (for example, MC7 to MCn) that are connected to the word lines WL7 to WLn between the selection word line WL6 and the second selection line GSL may be in an erase state.

The threshold voltages of the memory cells can affect boosting efficiency relative to an applied pass voltage. For example, it is assumed that a first memory cell has a first threshold voltage and a second memory cell has a second threshold voltage higher than the first threshold voltage. Voltages applied to the control gates of the first and second memory cells form and maintain channels in the first and second memory cells, and boost channel voltage. When the same voltage is applied to the control gates of the first and second memory cells, a voltage level forming and maintaining a channel in relation to the first memory cell is lower than a voltage level forming and maintaining a channel in relation to the second memory cell. Accordingly, the boosting efficiency of the first memory cell is higher than that of the second memory cell.

The flash memory device 200 according to an embodiment of the inventive concept applies the first pass voltage Vpass1 to the word lines WL1 to WLn to form a channel, and then applies the local voltage Vlocal to the non-selection word line WL3 to disconnect a portion of the channel (i.e., the non-selection channel). The non-selection channel 219a disconnected from the selection channel 219b corresponds to memory cells that have been preprogrammed. That is, a channel corresponding to the preprogrammed memory cells is disconnected by application of the local voltage Vlocal. However, the non-disconnected portion of the channel (i.e., the selection channel) is additionally boosted by the application of the second pass voltage Vpass2. Accordingly, boosting efficiency can be markedly improved.

If boosting efficiency improves, the level of an applied pass voltage (e.g., Vpass2) may be decreased, all other factors being equal. For example, the level of a pass voltage may be set as a level that prevents memory cell threshold disturbance routinely arising in conventional nonvolatile memory device when a pass voltage Vpass or programming voltage Vpgm is applied. "Disturbance of the pass voltage Vpass" refers to the fact that non-selection memory cells sharing a bit line with a selection memory cell (i.e., the memory cell to be programmed) may be soft programmed by application of the second pass voltage Vpass2. The disturbance of the pass voltage Vpass occurs when the level of the pass voltage Vpass becomes higher than a predetermined level.

"Disturbance of the programming voltage Vpgm" refers to the fact that a programming-inhibited memory cell may be programmed by application of the programming voltage Vpgm. When voltage difference between the programming voltage and the channel voltage of a programming-inhibited memory cell becomes greater than a predetermined value, the programming-inhibited memory cell can be prevented from being programmed by the programming voltage Vpgm.

If boosting efficiency improves, the level of a pass voltage Vpass required to boost the channel voltage of a programming-inhibited memory cell may be reduced in order to decrease the probability of a disturbance of the programming voltage Vpgm. That is, if boosting efficiency improves in a manner provided by embodiments of the inventive concept, the level of the second pass voltage Vpass2 may be reduced, as compared to pass voltages Vpass applied in conventional nonvolatile memory devices.

Thus, in certain embodiments of the inventive concept, the first pass voltage Vpass1 is applied to the word lines WL1 and WL2 corresponding to the non-selection channel 219a, but the second pass voltage Vpass2 is not applied. The first pass voltage Vpass1 has a level lower than the second pass voltage Vpass2. Accordingly, memory cell stress other wise caused by the pass voltage can be decreased.

In the foregoing method, the voltage of the non-selection channel 219a is boosted by application of the first pass voltage Vpass1, but it is not boosted by application of the second pass voltage Vpass2. That is, the voltage of the non-selection channel 219a has a level that is boosted only by application of the first pass voltage Vpass1. Since the voltage of the non-selection channel 219a remains relatively lower than it would if the second pass voltage Vpass2 were applied, GIDL between the non-selection channel 219a and the non-selection word line remains relatively lower.

Figure 10:
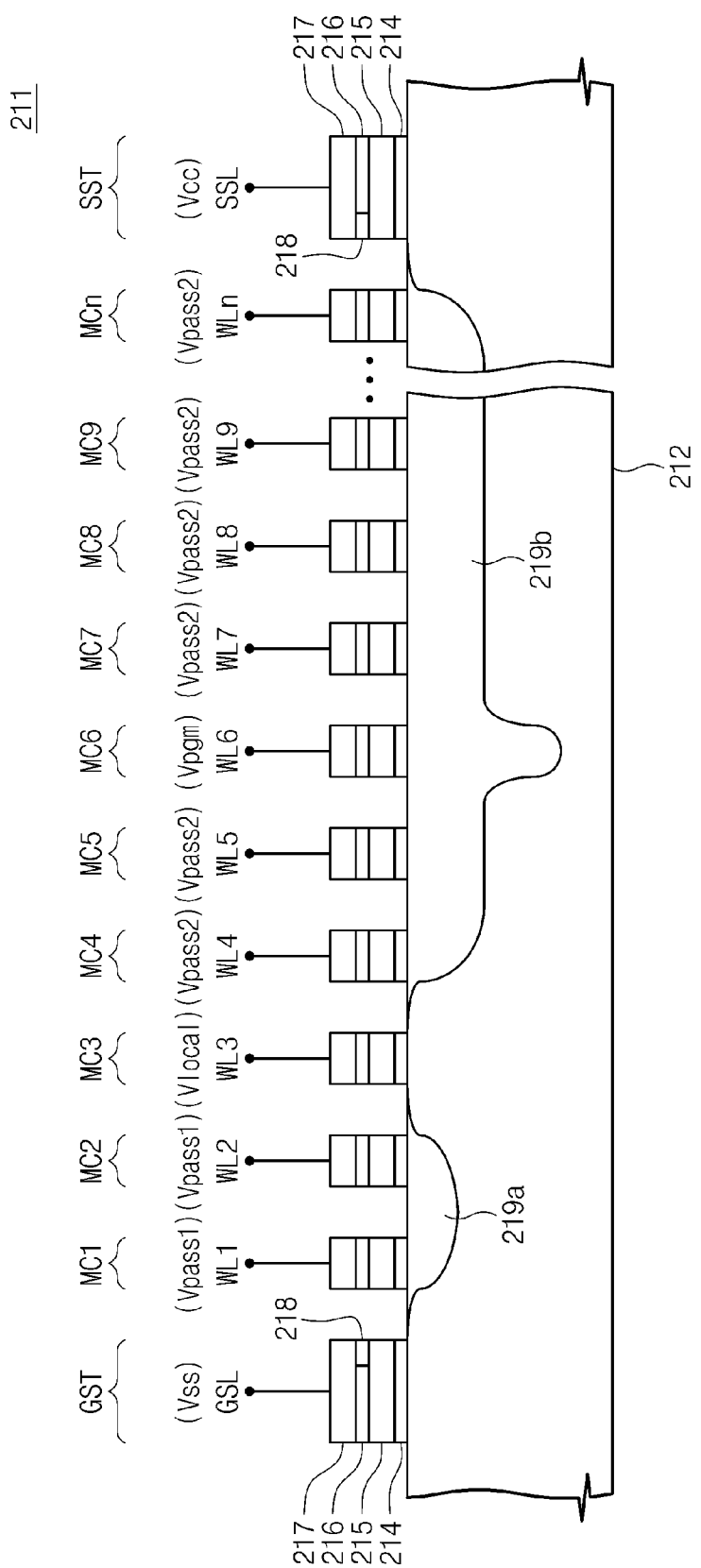

Referring again to FIG. 6, at a fourth time T4, the programming voltage Vpgm is applied to the selection word line WL6. That is, the selection channel 219b is boosted by application of the programming voltage Vpgm. The channel of the cells string 211, when a programming voltage is applied to the selection word line WL6, is illustrated in FIG. 10. Thus, the voltage of the selection channel 219b is boosted by application of the first pass voltage Vpass1, localized by application of the local voltage Vlocal, and is boosted by application of the second pass voltage Vpass2 and the programming voltage Vpgm. Accordingly, programming is inhibited in the memory cell MC6.

As described above, the flash memory device 200 according to the illustrated embodiment of the inventive concept applies the first pass voltage Vpass1 to the selection word line WL6 and the non-selection word line WL3, applies the local voltage Vlocal to the non-selection word line WL3, applies the second pass voltage Vpass2 to the selection word line WL6, and applies the programming voltage Vpgm to the selection word line WL6. Accordingly, boosting efficiency improves, pass voltage stress decreases, and GIDL decreases.

Figure 11:
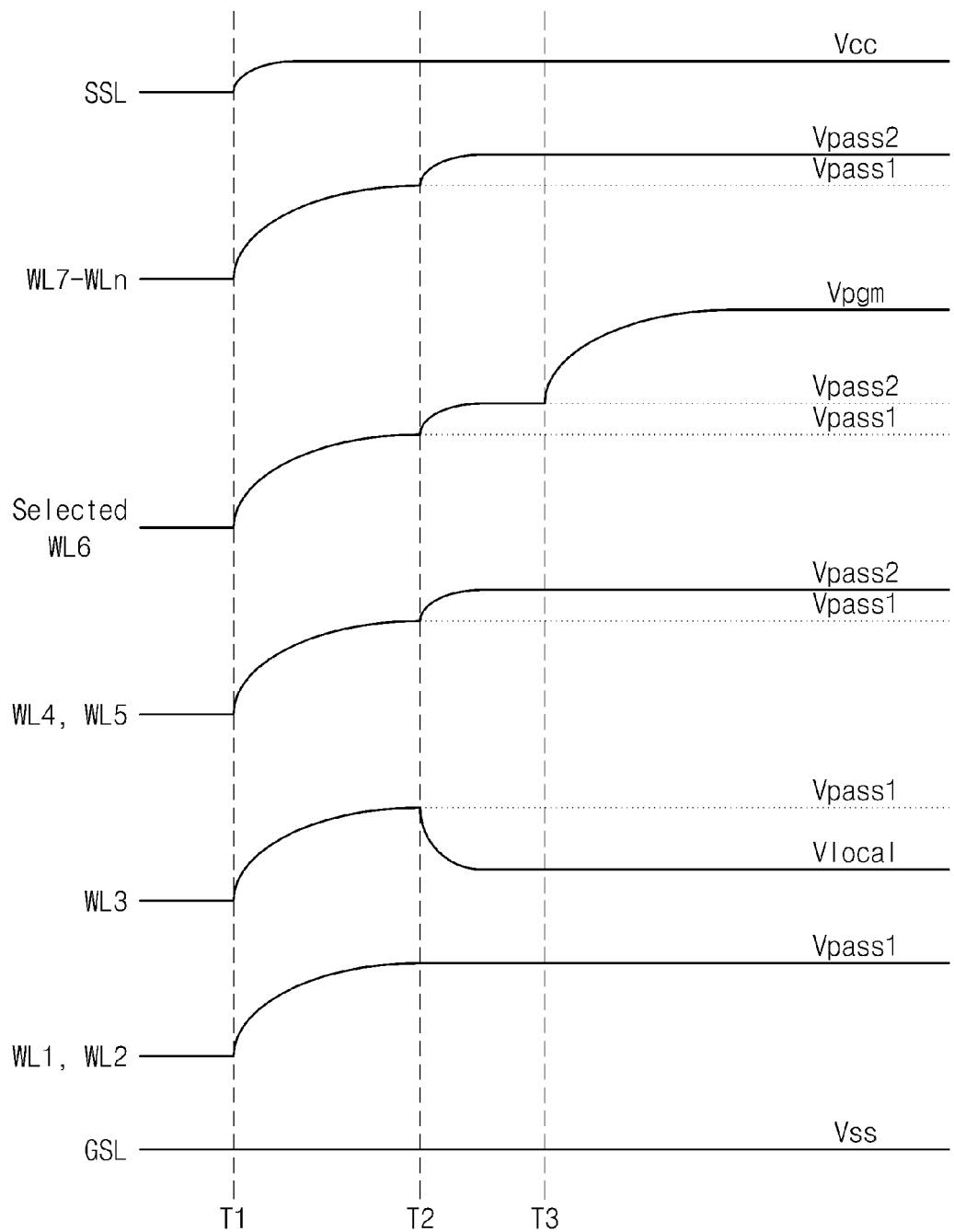
FIGS. 11 through 15 are respective timing diagrams further describing various embodiments of the exemplary programming method summarized in FIG. 5.

FIG. 11 is a timing diagram describing another embodiment of the exemplary programming method summarized in FIG. 5.

Referring collectively to FIGS. 4 and 11, at the first time T1, the first pass voltage Vpass1 is applied to the selection word line WL6 and the non-selection word line WL3. For example, the first pass voltage Vpass1 may be applied to the word lines WL1 to WLn between the first and second selection lines GSL and SSL. That is, by the first pass voltage Vpass1, a channel is formed in the cell string 211.

At the second time T2, the second pass voltage Vpass2 is applied to the selection word line WL6, and the local voltage Vlocal is applied to the non-selection word line WL3. For example, the second pass voltage Vpass2 may be applied to the word lines WL4 to WLn between the non-selection word line WL3 and the second selection line SSL. Furthermore, the local voltage Vlocal is applied to the non-selection word line WL3. That is, a channel that is formed by the first pass voltage Vpass1 may be disconnected by the local voltage Vlocal. The voltage of the selection channel among the disconnected channels may be boosted by the second pass voltage Vpass2.

At the third time T3, the programming voltage Vpgm is applied to the selection word line WL6. That is, the voltage of the selection channel is boosted by the programming voltage Vpgm.

Comparing the programming method previously described with reference to FIG. 6, the programming method illustrated in FIG. 11 applies the second pass voltage Vpass2 to the selection word line WL6 and applies the local voltage Vlocal to the non-selection word line WL3 at the same time. Accordingly, the programming method according to another embodiment of the inventive concept illustrated in FIG. 11 may be implemented with reduced programming time over the previous embodiment.

Figure 12:
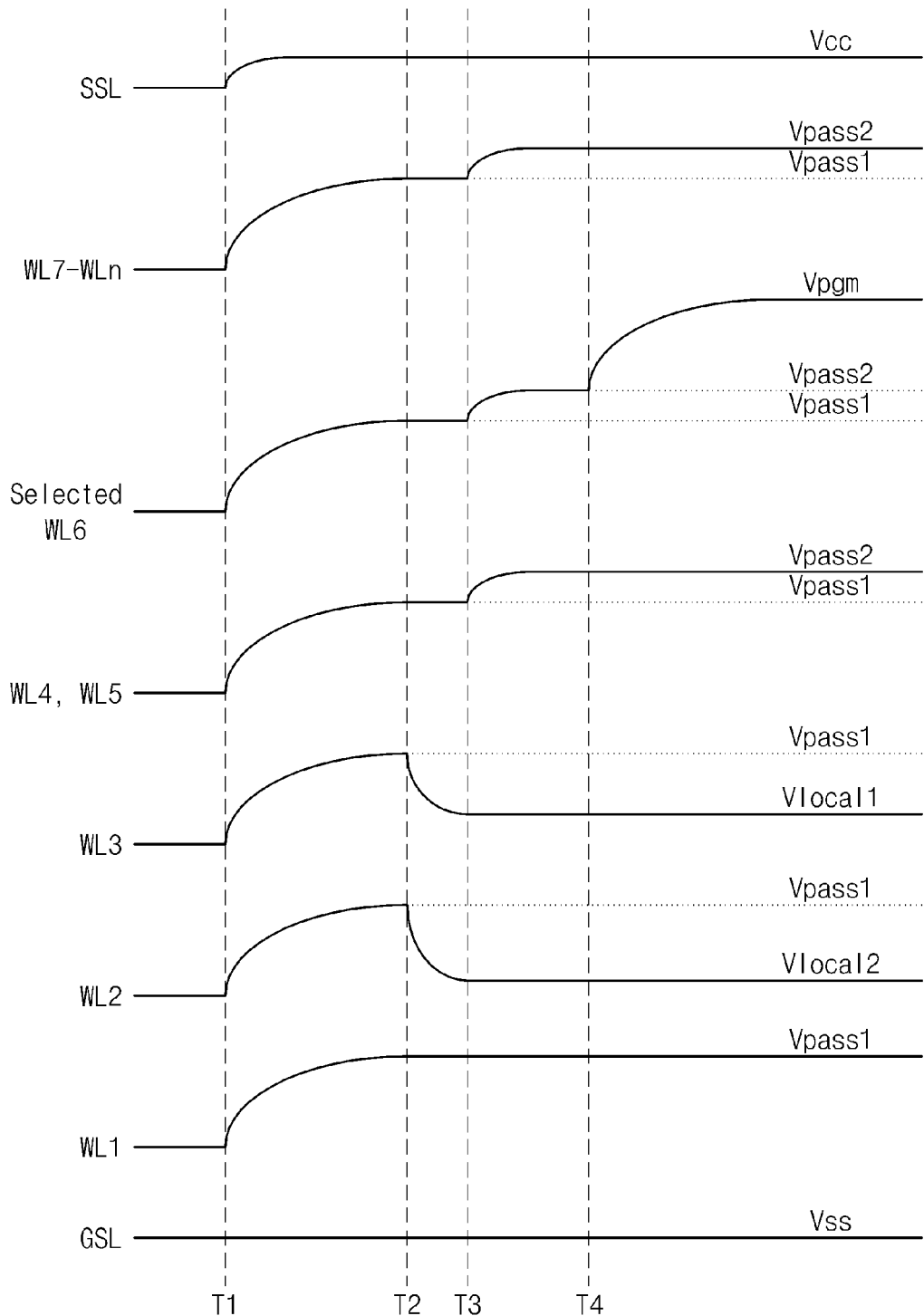

FIG. 12 is a timing diagram describing another embodiment of the exemplary programming method summarized in FIG. 5.

Referring collectively to FIGS. 4 and 12, at the first time T1, the first pass voltage Vpass1 is applied to the selection word line WL6 and the non-selection word lines WL2 and WL3. For example, the first pass voltage Vpass1 may be applied to the word lines WL1 to WLn between the first and second selection lines GSL and SSL. That is, by the first pass voltage Vpass1, a channel is formed in the cell string 211.

At the second time T2, first and second local voltages Vlocal1 and Vlocal2 are applied to the non-selection word lines WL2 and WL3. The first and second local voltages Vlocal1 and Vlocal2 are voltages for disconnecting a channel that is formed by the first pass voltage Vpass1. For example, the first and second local voltages Vlocal1 and Vlocal2 may be applied to the adjacent word lines WL2 and WL3. For example, the second local voltage Vlocal2 may be applied to the word line WL2 between the first selection line GSL and the word line WL 3 to which the first local voltage Vlocal1 is applied. For example, the level of the second local voltage Vlocal2 may be lower than that of the first local voltage Vlocal1. That is, a channel that is formed by the first pass voltage Vpass1 may be disconnected by the first and second local voltages Vlocal1 and Vlocal2.

At the third time T3, the second pass voltage Vpass2 is applied to the selection word line WL6. For example, the second pass voltage Vpass2 may be applied to the word lines WL4 to WLn between the non-selection word lines WL2 and WL3 and the second selection line SSL. That is, the voltage of a selection channel among the disconnected channels is boosted by the second pass voltage Vpass2.

At the fourth time T4, the programming voltage Vpgm is applied to the selection word line WL6. That is, the voltage of a selection channel is boosted by the programming voltage Vpgm.

Comparing this particular programming method with the method described in relation to FIG. 6, the current programming method according to another embodiment of the inventive concept applies the first and second local voltages Vlocal1 and Vlocal2 to the non-selection word lines WL2 and WL3.

A non-selection channel is boosted by the first pass voltage Vpass1. A selection channel is boosted by application of the first pass voltage Vpass1, is then localized by application of the local voltage Vlocal, and is then boosted by application of the second pass voltage Vpass2 and the programming voltage Vpgm. That is, the voltage of the selection channel is higher than that of the non-selection channel.

GIDL between the non-selection word lines WL2 and WL3 and the selection channel may be greater than that between the non-selection word lines WL2 and WL3 and the non-selection channel. Accordingly, when applying the first local voltage Vlocal1 higher than the second local voltage Vlocal2 to the word line WL3 adjacent to a selection channel among the non-selection word lines WL2 and WL3, GIDL decreases.

Moreover, when applying the second local voltage Vlocal2 lower than the first local voltage Vlocal1 to the non-selection word line WL2 adjacent to a non-selection channel, characteristic for disconnecting a selection channel and a non-selection channel can be enhanced.

As described above with reference to FIG. 11, a programming method according to another embodiment of the inventive concept applies the second pass voltage Vpass2 to the selection word line WL6 and applies the first and second local voltages Vlocal1 and Vlocal2 to the non-selection word lines WL2 and WL3 at the same time.

Figure 13:
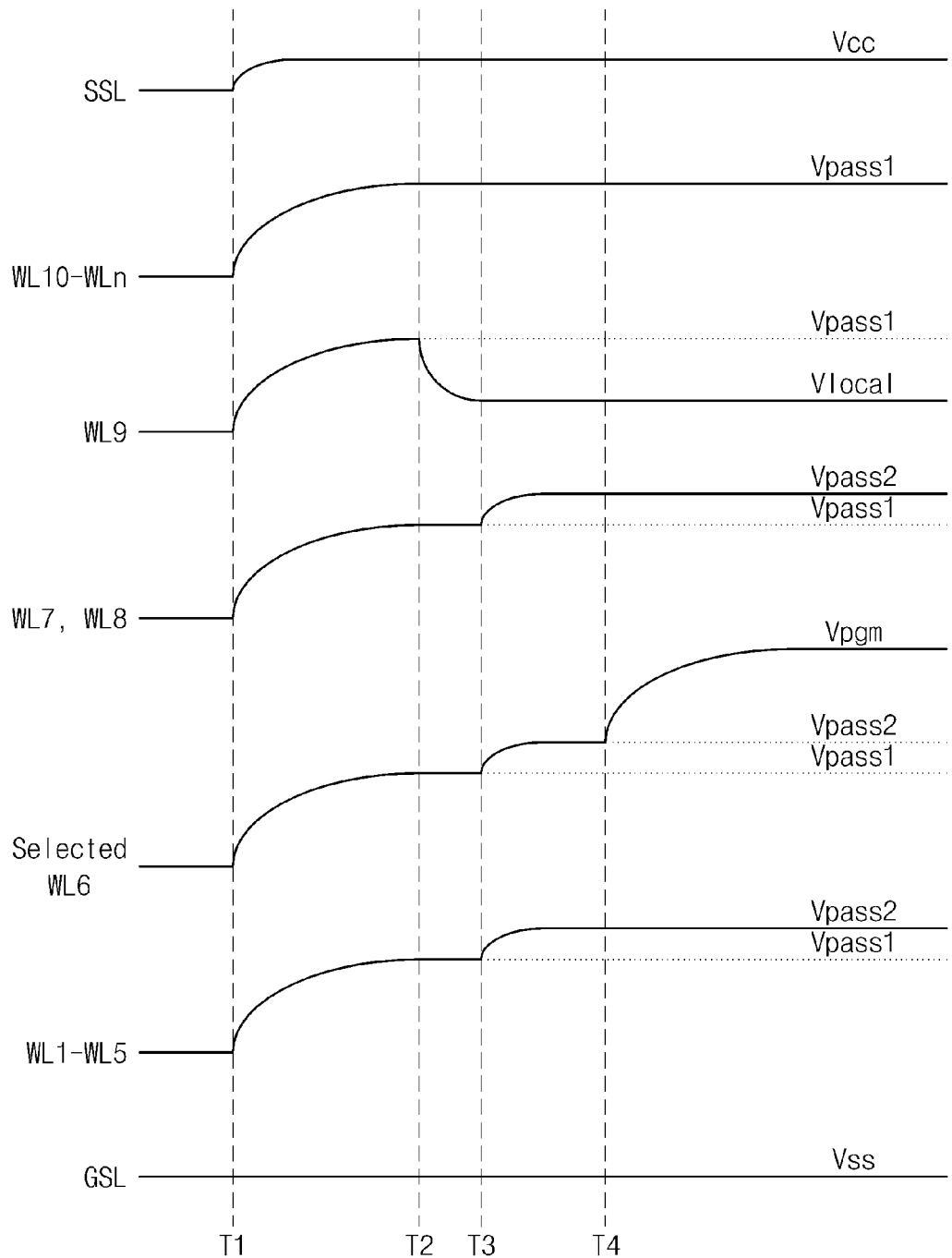

FIG. 13 is a timing diagram for describing yet another embodiment of the exemplary programming method summarized in FIG. 5.

Referring collectively to FIGS. 4 and 13, at the first time T1, the first pass voltage Vpass1 is applied to the selection word line WL6 and a non-selection word line WL9. For example, the first pass voltage Vpass1 is applied to the word lines WL1 to WLn between the first and second selection lines SSL and GSL. That is, a channel is formed in the cell string 211 by the first pass voltage Vpass1.

At the second time T2, the local voltage Vlocal is applied to the non-selection word line WL9. That is, a channel that is formed by the first pass voltage Vpass1 is disconnected by the local voltage Vlocal.

At the third time T3, the second pass voltage Vpass2 is applied to the selection word line WL6. For example, the second pass voltage Vpass2 is applied to the word lines WL1 to WL8 between the non-selection word line WL9 and the second selection line GSL. That is, the voltage of the selection channel is boosted by the second pass voltage Vpass2.

At the fourth time T4, the programming voltage Vpgm is applied to the selection word line WL6. That is, the voltage of the selection channel is boosted by the programming voltage Vpgm.

Comparing with the programming method that has been described above with reference to FIG. 6, a programming method according to another embodiment of the inventive concept applies the local voltage Vlocal to the non-selection word line WL9 between the selection word line WL6 and the first selection line SSL. That is, the programming method according to another embodiment of the inventive concept applies a local voltage to a word line between a selection word line and a string selection transistor.

As described above with reference to FIG. 11, a programming method according to another embodiment of the inventive concept may perform applying the second pass voltage Vpass2 to the selection word line WL6 and applying the local voltage Vlocal to the non-selection word line WL9 at the same time.

As described above with reference to FIG. 12, the programming method according to another embodiment of the inventive concept may perform applying the first local voltage Vlocal1 to a first non-selection word line and applying the second local voltage Vlocal2 to a second non-selection word line adjacent to the first non-selection word line.

Figure 14:
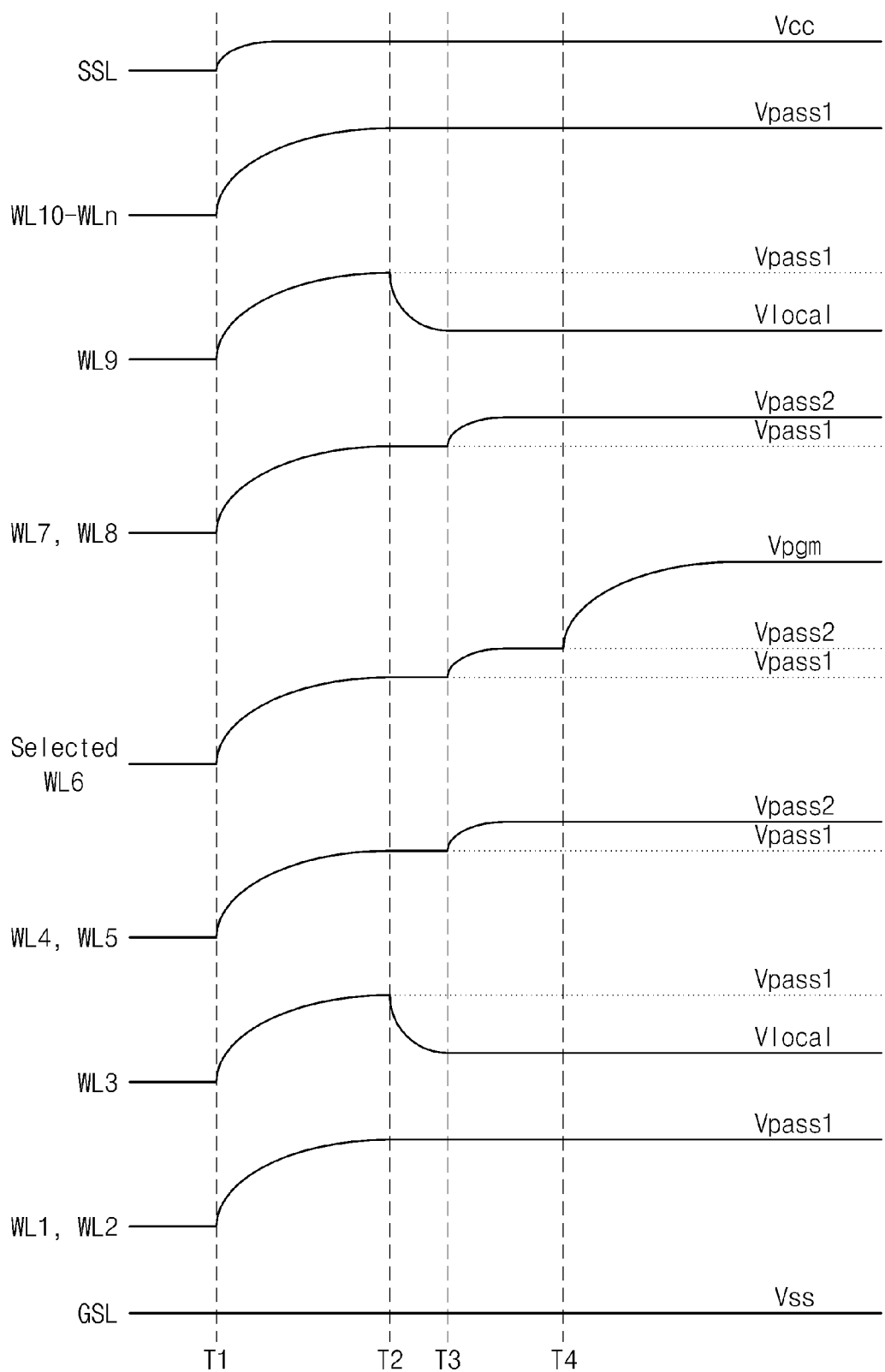

FIG. 14 is a timing diagram for describing still another embodiment of the exemplary programming method summarized in FIG. 5.

Referring collectively to FIGS. 4 and 14, at the first time T1, the first pass voltage Vpass1 is applied to the selection word line WL6 and the non-selection word lines WL3 and WL9. For example, the first pass voltage Vpass1 is applied to the word lines WL1 to WLn between the first and second selection lines GSL and SSL. That is, a channel is formed in the cell string 211 by the first pass voltage Vpass1.

At the second time T2, the local voltage Vlocal is applied to the non-selection word lines WL3 and WL9. One word line WL3 of the word lines to which the local voltage is applied to is disposed between the selection word line WL6 and the first selection line GSL, and the other one word line WL9 of the word lines is disposed between the selection word line WL6 and the second selection line SSL. That is, the channel of the cell string 211 is divided into three channels by the local voltage Vlocal.

At the third time T3, the second pass voltage Vpass2 is applied to the selection word line WL6. For example, the second pass voltage Vpass2 may be applied to the word lines WL4 to WL8 between the non-selection word lines WL3 and WL9. That is, the voltage of a selection channel is boosted by the second pass voltage Vpass2.

At the fourth time T4, the programming voltage Vpgm is applied to the selection word line WL6. That is, the voltage of a selection channel is boosted by the programming voltage Vpgm.

Comparing with the programming method that has been described above with reference to FIG. 6, a programming method according to another embodiment of the inventive concept applies the local voltage Vlocal to the non-selection word lines WL9 and WL3 between the selection word line WL6 and the second selection line SSL and between the selection word line WL6 and the first selection line SSL. That is, the programming method according to another embodiment of the inventive concept may be localized between a selection word line and a string selection line and between the selection word line and a ground selection line.

As described above with reference to FIG. 11, a programming method according to another embodiment of the inventive concept may perform applying the second pass voltage Vpass2 to the selection word line WL6 and applying the local voltage Vlocal to the non-selection word lines WL3 and WL9 at the same time.

As described above with reference to FIG. 12, the programming method according to another embodiment of the inventive concept may apply the first local voltage Vlocal1 to the first non-selection word line WL3 or WL9, apply the second local voltage to the second non-selection word line WL2 or WL10 adjacent to the first non-selection word line WL3 or WL9.

Figure 15:
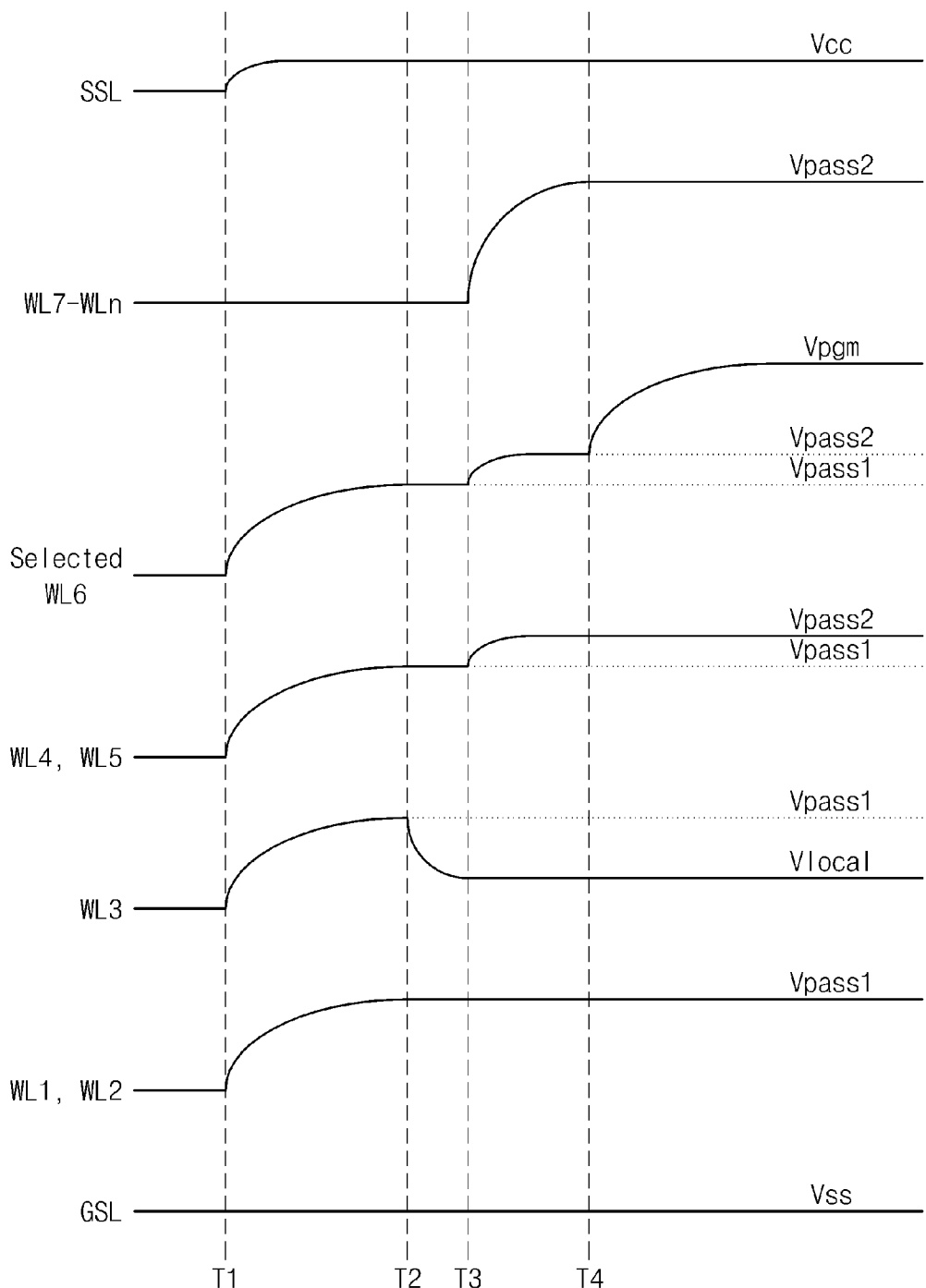
Figure 16:
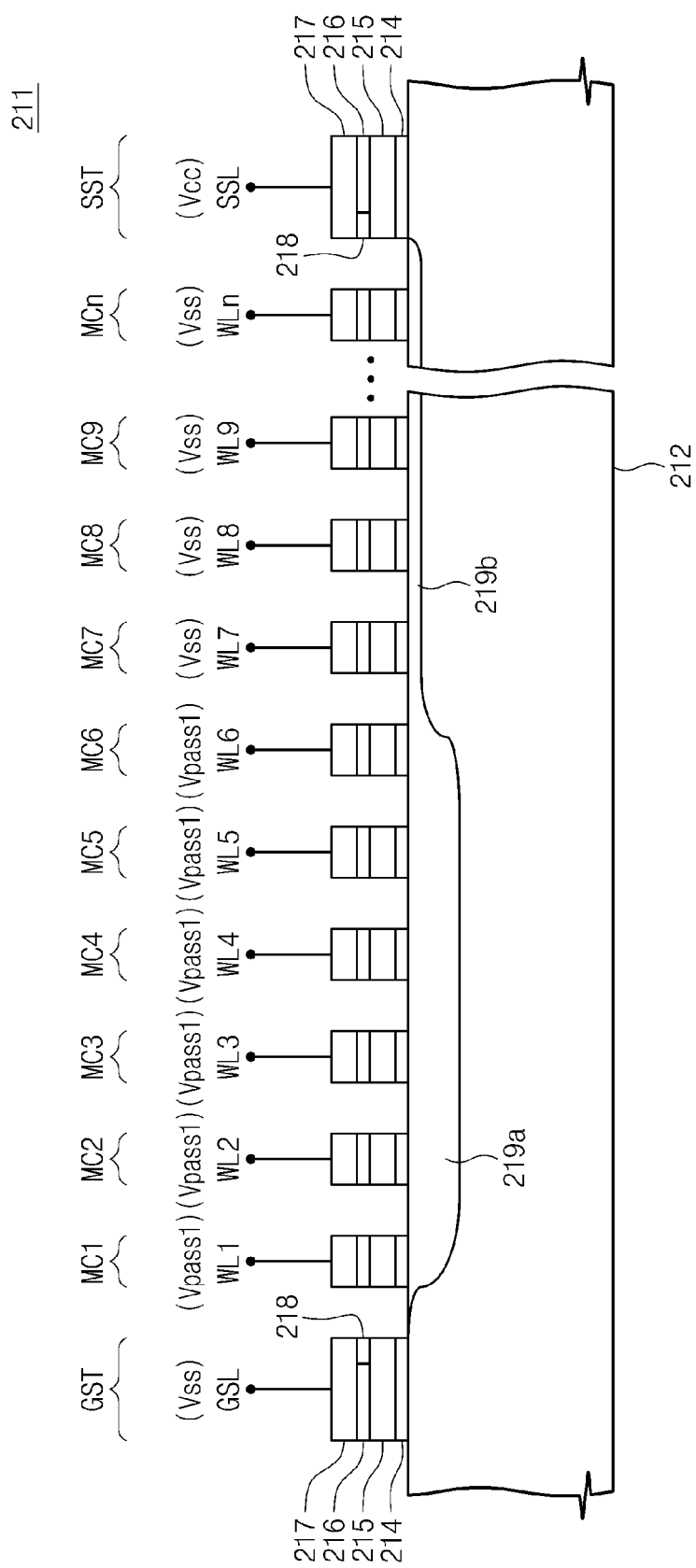
FIG. 16 is a diagram illustrating the channel state of a cell string based on the timing diagram of FIG. 15.

FIG. 15 is a timing diagram for describing yet another embodiment of the exemplary programming method summarized in FIG. 5. FIG. 16 is a cross-sectional diagram illustrating the state of the channel for the cell string 211 (see FIG. 14) based on the timing of control voltages illustrated in FIG. 15.

Referring collectively to FIGS. 4 and 15, at the first time T1, the first pass voltage Vpass1 is applied to the selection word line WL6 and the non-selection word line WL3. For example, the first pass voltage Vpass1 may be applied to the word lines WL1 to WL5 between the selection word line WL6 and the first selection lines GSL. Furthermore, ground voltage Vss may be applied to the word lines WL7 to WLn between the selection word line WL6 and the second selection line SSL.

In order to prevent coupling during the programming operation, as described above, the memory cells are programmed in order from the memory cells adjacent to the first selection line GSL to the memory cells adjacent to the second selection line SSL. When the word line WL6 is a selection word line, the memory cells that are connected to the word lines WL7 to WLn between the selection word line WL6 and the second selection line SSL may be in an erase state. That is, when ground voltage Vss is applied to the word lines WL7 to WLn, a channel is formed in a channel region corresponding to the word lines WL7 to WLn.

When the first pass voltage Vpass1 is applied to the word lines WL1 to WL6 and the ground voltage Vss is applied to the word lines WL7 to WLn, the state of channel of the cell string 211 is illustrated in FIG. 16.

Referring to FIG. 16, the channel region 219a, corresponding to the word lines WL1 to WL6 to which the first pass voltage Vpass1 is applied, is formed relatively deeper than the channel region 219b that corresponds to the word lines WL7 to WLn to which ground voltage Vss is applied.

The voltage of the channel region 219a may be boosted by the first pass voltage Vpass1. An electrical carrier (e.g., an electron or a hole) boosted by the first pass voltage Vpass1 in the channel region 219a may move to the channel region 219b under a charge sharing effect. That is, the voltage of the channel region 219b may be boosted by charge sharing. Moreover, the voltage of the channel region 219a may be boosted by charge sharing.

As an example, it is assumed that the voltage of a channel region corresponding to the selection word line WL6 reaches a first voltage V1 by charge sharing. For example, the first voltage V1 may be higher than the ground voltage Vss. For example, the level of the first voltage V1 may be higher than a value that is obtained by subtracting the threshold value of the string selection transistor SST from the voltage Vcc.

Referring again to FIGS. 4 and 15, at the second time T2, the local voltage Vlocal is applied to the non-selection word line WL3. That is, a channel that is formed by the first pass voltage Vpass1 and the ground voltage Vss may be divided into a selection channel and a non-selection channel by the local voltage Vlocal.

At the third time T3, the second pass voltage Vpass2 is applied to the selection word line WL6. For example, the second pass voltage Vpass2 may be applied to the word lines WL4 to WLn between the non-selection word line WL3 and the second selection line SSL. That is, the voltage of a selection channel may be boosted by the second pass voltage Vpass2.

The voltages of the word lines WL7 to WLn between the selection word line WL6 and the second selection line SSL are boosted from the ground voltage Vss to the second pass voltage Vpass2. That is, the voltage of a selection channel may be boosted in correspondence with difference between the second pass voltage Vpass2 and the ground voltage Vss. The voltage of the selection channel may be boosted from the first voltage V1.

At the fourth time T4, the programming voltage Vpgm is applied to the selection word line WL6. That is, the voltage of a selection channel may be boosted by the programming voltage Vpgm.

Comparing with the programming method that has been described above with reference to FIG. 6, in a programming method according to another embodiment of the inventive concept, the voltage of a selection channel is boosted from the first voltage V1 in correspondence with difference between the second pass voltage Vpass2 and the ground voltage Vss. Accordingly, boosting efficiency may be markedly improved.

In FIG. 15, the first pass voltage Vpass1 is applied to the word lines WL1 and WL2 corresponding to the channel region 219a, and the ground voltage Vss is applied to the word lines WL4 to WLn corresponding to the channel region 219b. Subsequently, the local voltage Vlocal is applied to the word line WL3. In FIG. 6, the first pass voltage Vpass1 is applied to the word lines WL1, WL2 and WL4 to WLn that correspond to the channel regions 219a and 219b. Subsequently, the local voltage Vlocal is applied to the word lines WL3.

The depth of the channel region 219b, which has been described above with reference to FIG. 6, is greater than that of the channel region 219b which has been described above with reference to FIG. 15. That is, the number of charges of the channel region 219b, which has been described above with reference to FIG. 6, is less than the number of charges of the channel region 219b that has been described above with reference to FIG. 15. When the second pass voltage Vpass2 is applied to the word lines WL4 to WLn corresponding to the channel region 219b, the depth of the channel region 219b which has been described above with reference to FIG. 6 is similar to that of the channel region 219b which has been described above with reference to FIG. 15. At this point, the charge density of the channel region 219b which has been described above with reference to FIG. 6 is higher than that of the channel region 219b which has been described above with reference to FIG. 15. Comparing with the programming method that has been described above with reference to FIG. 6, accordingly, the boosting efficiency of the programming method that has been described above with reference to FIG. 15 can be enhanced.

As described above with reference to FIG. 11, a programming method according to another embodiment of the inventive concept may perform applying the second pass voltage Vpass2 to the selection word line WL6 and applying the local voltage Vlocal to the non-selection word line WL3 at the same time.

As described above with reference to FIG. 12, the programming method according to another embodiment of the inventive concept applies the first local voltage Vlocal1 to the first non-selection word line WL3, and applies the second local voltage Vlocal2 to the second non-selection word line WL2 adjacent to the first non-selection word line WL3.

As described above with reference to FIG. 14, the programming method according to another embodiment of the inventive concept applies the local voltage Vlocal to the first non-selection word line WL3 between the selection word line WL6 and the first selection line GSL, and applies the local voltage Vlocal to the second non-selection word line WL9 between the selection word line WL6 and the second selection line SSL.

Figure 17:
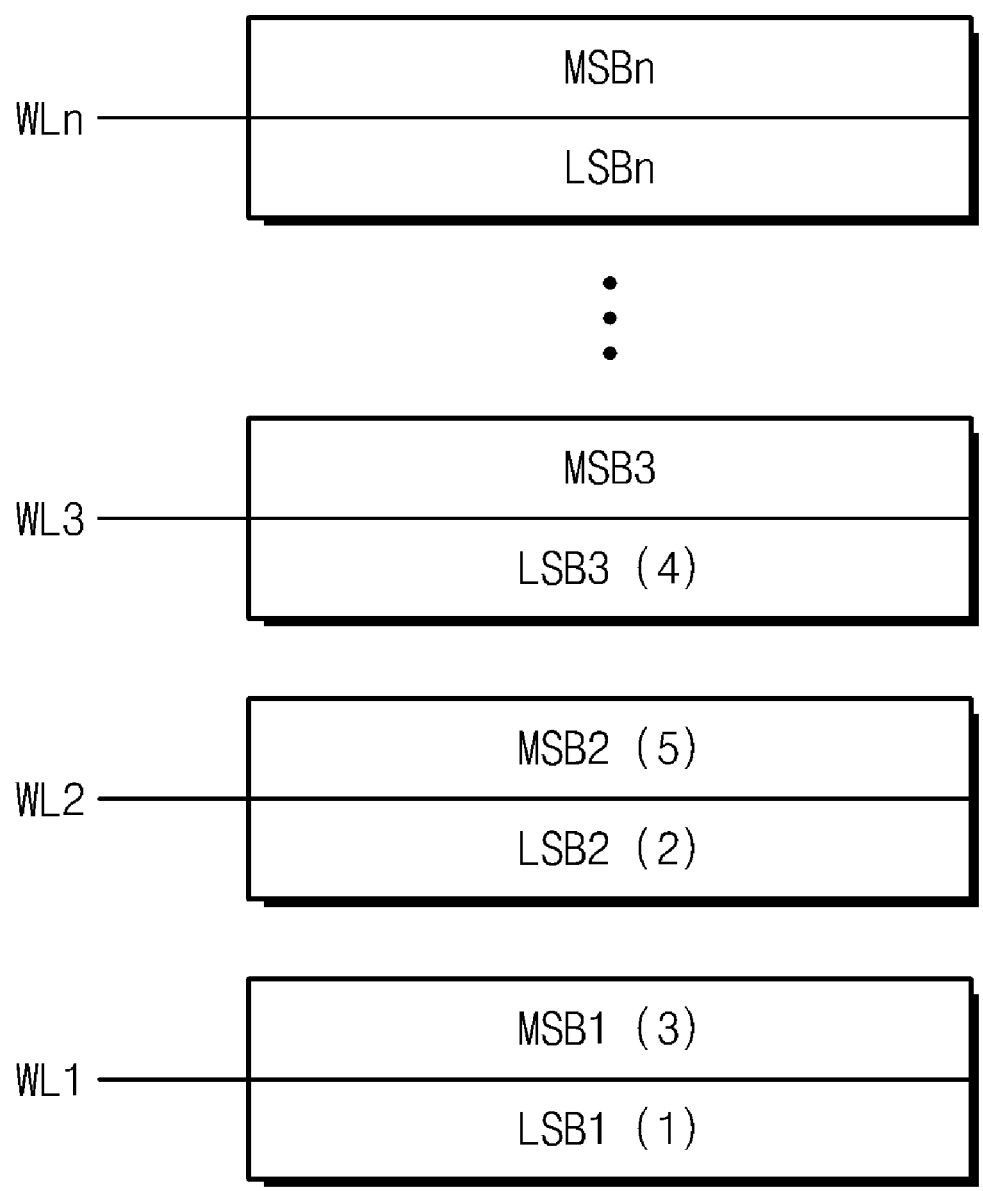
FIGS. 17 through 19 are conceptual diagrams describing yet another embodiment of the exemplary programming method summarized in FIG. 5.
Figure 18:
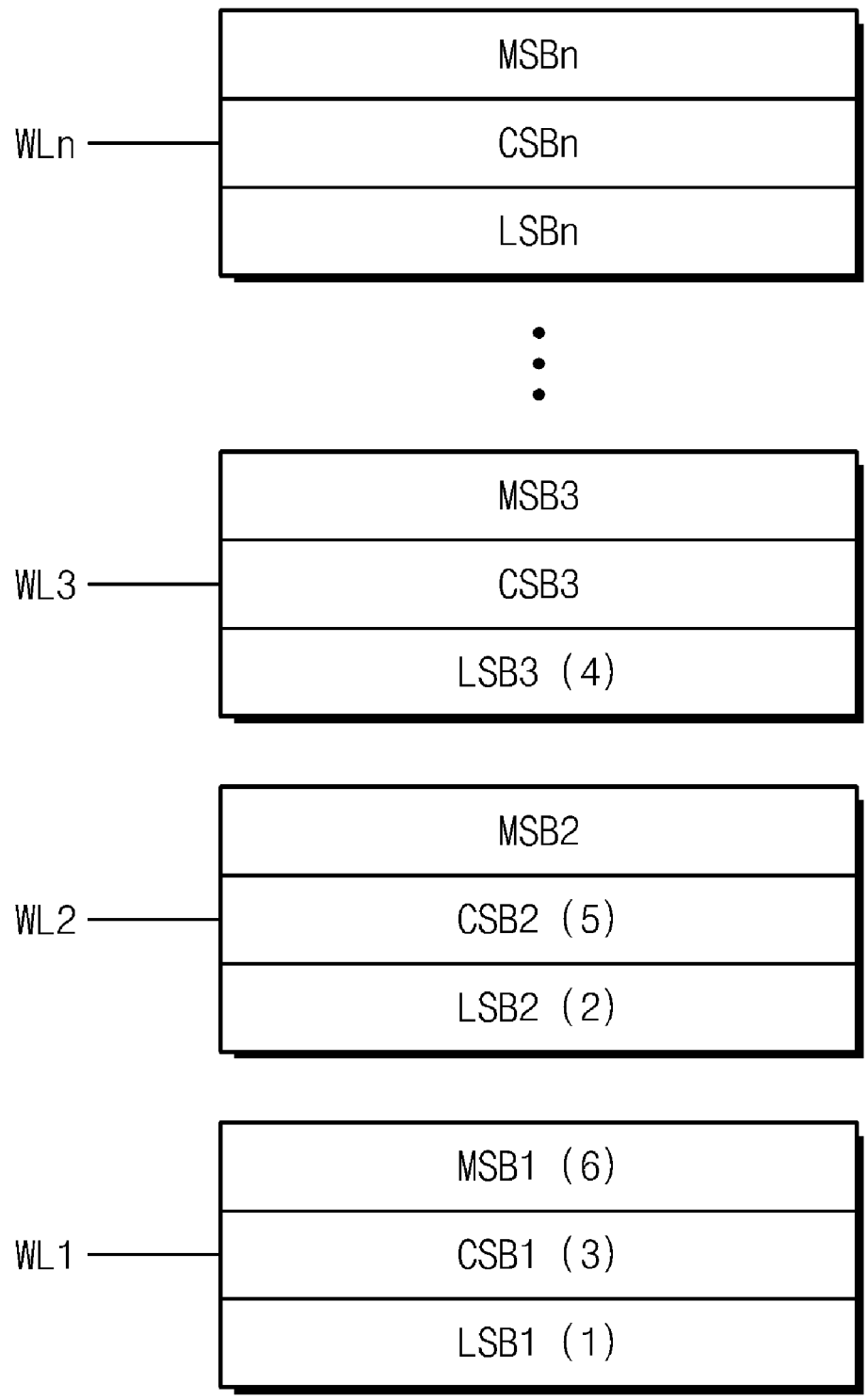
Figure 19:
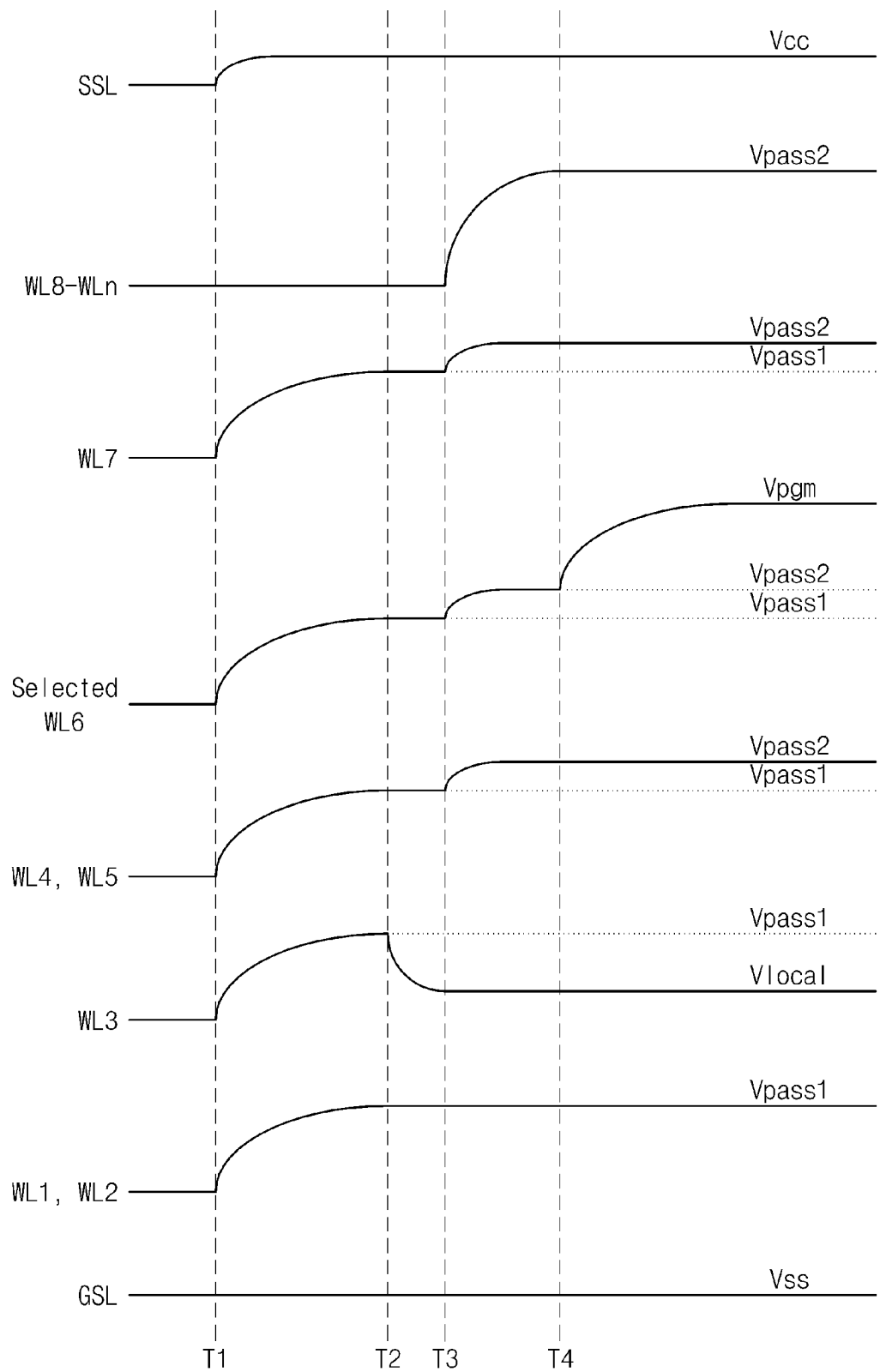

FIGS. 17 through 19 are conceptual diagrams describing another embodiment of the exemplary programming method summarized in FIG. 5.

FIG. 17 illustrates an embodiment of the programming pattern of the memory cell array 210 in FIG. 3. For example, it is assumed that the memory cell array 210 stores two bits per cell. Least Significant Bits (LSB), which are stored in memory cells connected to one word line, form one page (for example, a least significant page). Most Significant Bits (MSB), which are stored in memory cells connected to a corresponding word line, form another page (for example, a most significant page). That is, as illustrated in FIG. 17, memory cells that are connected to one word line form two pages (for example, a least significant page and a most significant page).

In FIG. 17, for conciseness, memory cells are omitted, and pages that are formed by the memory cells are illustrated. The word line WL1 is connected to corresponding pages MSB1 and LSB1. The word line WL2 is connected to corresponding pages MSB2 and LSB2. The word line WL3 is connected to corresponding pages MSB3 and LSB3. The word line WLn is connected to corresponding pages MSBn and LSBn.

In order prevent coupling during a programming operation, each page may be programmed in order that is as illustrated in FIG. 17. First, the least significant page LSB1 that is connected to the word line WL1 is programmed. Subsequently, the least significant page LSB2 that is connected to the word line WL2 is programmed. Subsequently, the most significant page MSB1 that is connected to the word line WL1 is programmed. Subsequently, the least significant page LSB3 that is connected to the word line WL3 is programmed. Subsequently, the most significant page MSB2 that is connected to the word line WL2 is programmed.

That is, the least significant pages LSB1 to LSBn that are connected to the word lines WL1 to WLn are programmed in order from the page LSB1 adjacent to the first selection line GSL (see FIG. 3) to the page LSBn adjacent to the second selection line SSL. Likewise, the most significant pages MSB1 to MSBn that are connected to the word lines WL1 to WLn are programmed in order from the page MSB1 adjacent to the first selection line GSL to the page MSBn adjacent to the second selection line SSL. The least significant page of the first word line is programmed prior to the most significant page of the second word line that is disposed between the first word line and the first selection line GSL.

That is, the word line WL6 (see FIG. 3) is a selected word line, and when the most significant page of the selection word line WL 6 is programmed, memory cells that are connected to a word line (for example, WL7) between the selection word line WL6 and the second selection line SSL may be in a programming state, and in more detail, the least significant page may be in the programming state.

FIG. 18 illustrates another embodiment of the programming pattern of the memory cell array 210 in FIG. 3. For example, it is assumed that the memory cell array 210 stores three bits per cell. Least Significant Bits (LSB), which are stored in memory cells connected to one word line, form one page (for example, a least significant page). Most Significant Bits (MSB), which are stored in memory cells connected to a corresponding word line, form another page (for example, a most significant page). Central Significant Bits (CSB), which are stored in memory cells connected to a corresponding word line, form another page (for example, a central significant page).

That is, as illustrated in FIG. 18, memory cells that are connected to one word line form three pages (for example, a least significant page, a central significant page and a most significant page).

In FIG. 18, for conciseness, memory cells are omitted, and pages that are formed by the memory cells are illustrated. As illustrated in FIG. 18, the word lines WL1 to WLn are connected to corresponding pages LSB1 to LSBn, CSB1 to CSBn and MSB1 to MSBn.

In order to prevent coupling during a programming operation, each page may be programmed in order that is as illustrated in FIG. 18. First, the least significant page LSB1 that is connected to the word line WL1 is programmed. Subsequently, the least significant page LSB2 that is connected to the word line WL2 is programmed. Subsequently, the central significant page CSB1 that is connected to the word line WL1 is programmed. Subsequently, the least significant page LSB3 that is connected to the word line WL3 is programmed. Subsequently, the central significant page CSB2 that is connected to the word line WL2 is programmed. Subsequently, the most significant page MSB1 that is connected to the word line WL1 is programmed.

That is, the least significant pages LSB1 to LSBn that are connected to the word lines WL1 to WLn are programmed in order from the page LSB1 adjacent to the first selection line GSL (see FIG. 3) to the page LSBn adjacent to the second selection line SSL. The central significant page CSB1 to CSBn that are connected to the word lines WL1 to WLn are programmed in order from the page CSB1 adjacent to the first selection line GSL to the page CSBn adjacent to the second selection line SSL. The most significant pages MSB1 to MSBn that are connected to the word lines WL1 to WLn are programmed in order from the page MSB1 adjacent to the first selection line GSL to the page MSBn adjacent to the second selection line SSL.

The least significant page of the first word line is programmed prior to the central significant page of the second word line that is disposed between the first word line and the first selection line GSL. The central significant page of the first word line is programmed prior to the most significant page of the second word line.

That is, the word line WL6 (see FIG. 3) is a selected word line, and when the most significant page of the selection word line WL6 is programmed, memory cells that are connected to word lines (for example, WL7 and WL8) between the selection word line WL6 and the second selection line SSL may be in a programming state, and in more detail, the central significant page and the least significant page may be in the programming state.

As described above with reference to FIGS. 17 and 18, among memory cells that are connected to the word lines WL7 to WLn between the selection word line WL6 and the second selection line SSL, programmed memory cells do not form channels in response to the ground voltage Vss. To overcome these limitations, a programming method according to another embodiment of the inventive concept includes applying the first pass voltage Vpass1 to a word line group that includes at least one word line between the selection word line WL6 and the second selection line SSL.

Referring collectively to FIGS. 4 and 19, at the first time T1, the first pass voltage Vpass1 is applied to the selection word line WL6 and the non-selection word line WL3. For example, the first pass voltage Vpass1 may be applied to the selection word line WL6 and the word lines WL1 to WL5 between the selection word line WL6 and the first selection line GSL. Furthermore, the first pass voltage Vpass1 may be applied to a word line group WL7 that includes at least one word line (for example, WL7) between the selection word line WL6 and the second selection line SSL. The ground voltage Vss may be applied to the word lines WL8 to WLn between the word line group WL7 and the second selection line Vss.

Memory cells that are connected to the word line group WL7 may be memory cells that pre-store at least one bit per cell. As an example, in a case that is as described above with reference to FIG. 17, memory cells that are connected to the word line group WL7 may pre-store the least significant bit.

As another example, in a case that is as described above with reference to FIG. 18, the memory cells that are connected to the word line WL7 may pre-store the least significant bit or the central significant bit. When the memory cells that are connected to the word line WL7 store the central significant bit, memory cells that are connected to the word line WL8 store the least significant bit. At this point, for forming a channel, the first pass voltage Vpass1 may be applied to the word line group WL7 and a word line group WL8 that respectively includes at least one word line WL7 and word line WL8 between the selection word line WL6 and the second selection line SSL.

That is, when programmed memory cells among memory cells that are connected to the word lines WL7 to WLn between the selection word line WL6 and the second selection line SSL exist, corresponding word lines may be included in a word line group. That is, the first pass voltage Vpass1 may be applied to word lines that are connected to the programmed memory cells. Furthermore, the ground voltage Vss may be applied to word lines between the word line group and the second selection line SSL.

A channel may be formed in the cell string 211 by the first pass voltage Vpass1 and the ground voltage Vss. As described above with reference to FIGS. 15 and 16, it is assumed that the voltage of a channel region corresponding to the selection word line WL6 reaches a second voltage V2 by charge sharing. For example, the level of the second voltage V2 may be higher than the ground voltage Vss. For example, the level of the second voltage V2 may be higher than a value that is obtained by subtracting the threshold voltage of the string selection transistor SST from the voltage Vcc.

At the second time T2, the local voltage Vlocal is applied to the non-selection word line WL3. That is, the channel that is formed by the first pass voltage Vpass1 and the ground voltage Vss is divided into a selection channel and a non-selection channel by the local voltage Vlocal.

At the third time T3, the second pass voltage Vpass2 is applied to the word lines WL4 to WLn between the non-selection word line WL3 and the second selection line SSL. That is, the voltage of the selection channel is boosted from the second voltage V2 by the second pass voltage Vpass2.

At the fourth time T4, the programming voltage Vpgm is applied to the selection word line WL6. That is, the voltage of the selection channel is boosted by the programming voltage Vpgm.

That is, the voltage of the selection channel is boosted from the second voltage V2 in correspondence with difference between the second pass voltage Vpass2 and the ground voltage Vss. Accordingly, boosting efficiency can be markedly improved.

As described above with reference to FIG. 15, the charge density of the channel region 219b which has been described above with reference to FIG. 19 is lower than that of the channel region 219b which has been described above with reference to FIG. 6. Comparing with the programming method that has been described above with reference to FIG. 6, accordingly, the boosting efficiency of the programming method that has been described above with reference to FIG. 19 can be enhanced.

As described above with reference to FIG. 11, a programming method according to another embodiment of the inventive concept may perform applying the second pass voltage Vpass2 to the selection word line WL6 and applying the local voltage Vlocal to the non-selection word line WL3 at the same time.

As described above with reference to FIG. 12, the programming method according to another embodiment of the inventive concept applies the first local voltage Vlocal1 to the first non-selection word line WL3, and applies the second local voltage Vlocal2 to the second non-selection word line WL2 adjacent to the first non-selection word line WL3.

As described above with reference to FIG. 14, the programming method according to another embodiment of the inventive concept applies the local voltage Vlocal to the first non-selection word line WL3 between the selection word line WL6 and the first selection line GSL, and applies the local voltage Vlocal to the second non-selection word line WL9 between the selection word line WL6 and the second selection line SSL.

In the above-described embodiments, the programming method of the flash memory device 200 that stores two bits per cell and stores three bits per cell has been described above. However, the programming method according to embodiments of the inventive concept is not limited to the number of bits that are stored for each cell.

In the above-described embodiments, when the first pass voltage Vpass1 is applied to the word lines, the voltage Vcc is applied to the string selection line SSL. However, the voltage Vcc that is applied to the string selection line SSL is for boosting a channel, and a time when the voltage Vcc is applied to the string selection line SSL is not limited.

In the above-described embodiments, embodiments of the inventive concept have been described above with reference to an example of the NAND flash memory. However, embodiments of the inventive concept are not limited to the NAND flash memory. For example, embodiments of the inventive concept may be applied to a nonvolatile memory device such as ROM, PROM, EPROM, EEPROM, flash memory device, PRAM, MRAM, RRAM and FRAM.

Figure 20:
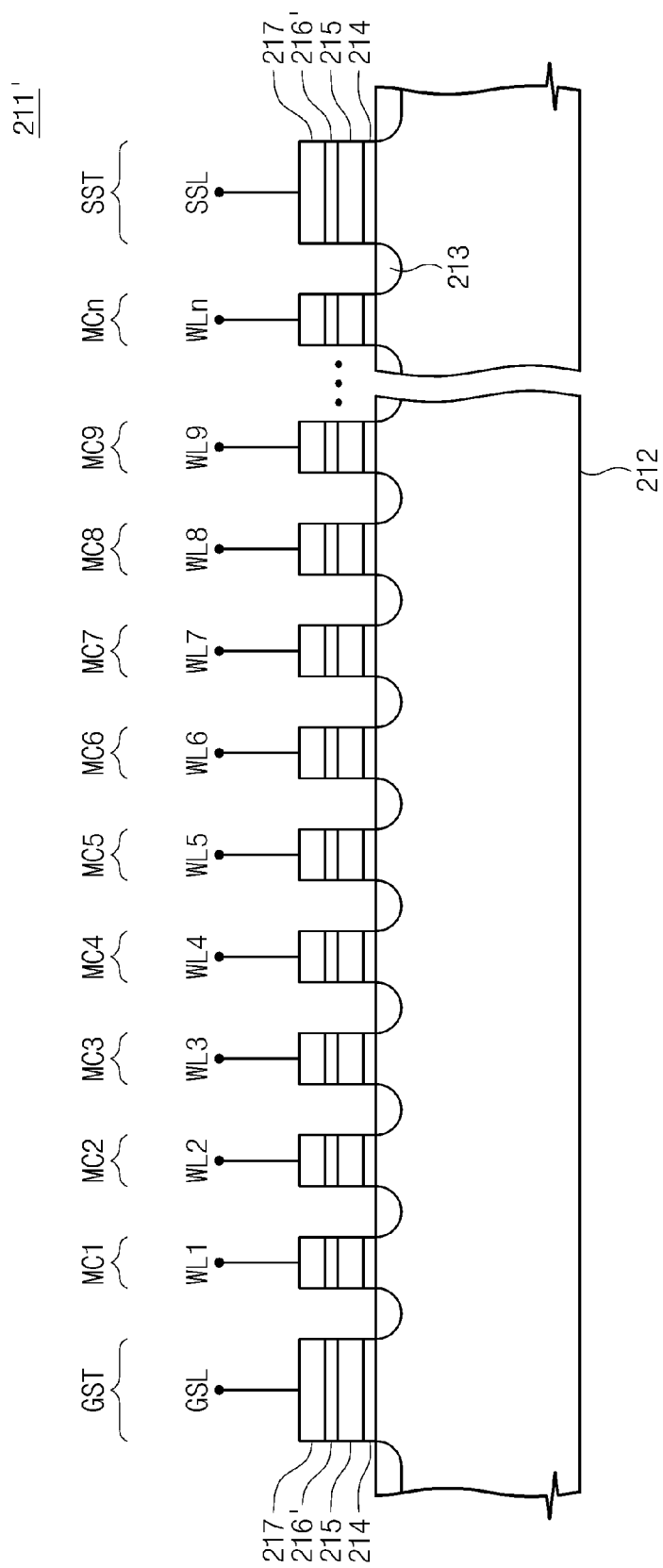
FIG. 20 is a cross-sectional view illustrating another embodiment 211' of the cell string 211 of the memory cell array 210 in FIG. 3.

FIG. 20 is a cross-sectional view illustrating another embodiment 211' of the cell string 211 of the memory cell array 210 in FIG. 3.

Referring to FIG. 20, a source/drain region 213 is provided to a bulk region 212. As an example, the bulk region 212 may be a P-type well (p-well, pocket p-well). For example, the source/drain region 213 may be an N-type well. The source/drain region 213 may be provided as the source region and drain region of the memory cells MC1 to MCn.

Gate structures are provided onto the bulk region 212. Each of the gate structures includes a tunnel dielectric layer 214, a charge trapping layer 215, a blocking dielectric layer 216, and a control gate 217.

Except for the structures of the sting selection transistor SST and the ground selection transistor GST, the structure of a cell string 211' is the same as that of the cell string 211 that has been described above with reference to FIG. 4. Therefore, a more detailed description on this will be omitted.

Comparing with the cell string 211 that has been described above with reference to FIG. 4, in the cell string 211' according to another embodiment of the inventive concept, the charge trapping layer 215 and control gate 217 of the string selection transistor SST are disconnected in electricity. Moreover, the charge trapping layer 215 and control gate 217 of the ground selection transistor GST are disconnected in electricity. That is, a via contact is not provided to the blocking dielectric layers 216' of the selection transistors SST and GST.

As an example, the charge trapping layer 215 may include a conductor such as polysilicon. That is, the charge trapping layer 215 may be a floating gate for accumulating charges. As another example, the charge trapping layer 215 may include an insulator such as silicon oxide or silicon nitride. That is, the charge trapping layer 215 may be a charge trap for trapping charges.

Figure 21:
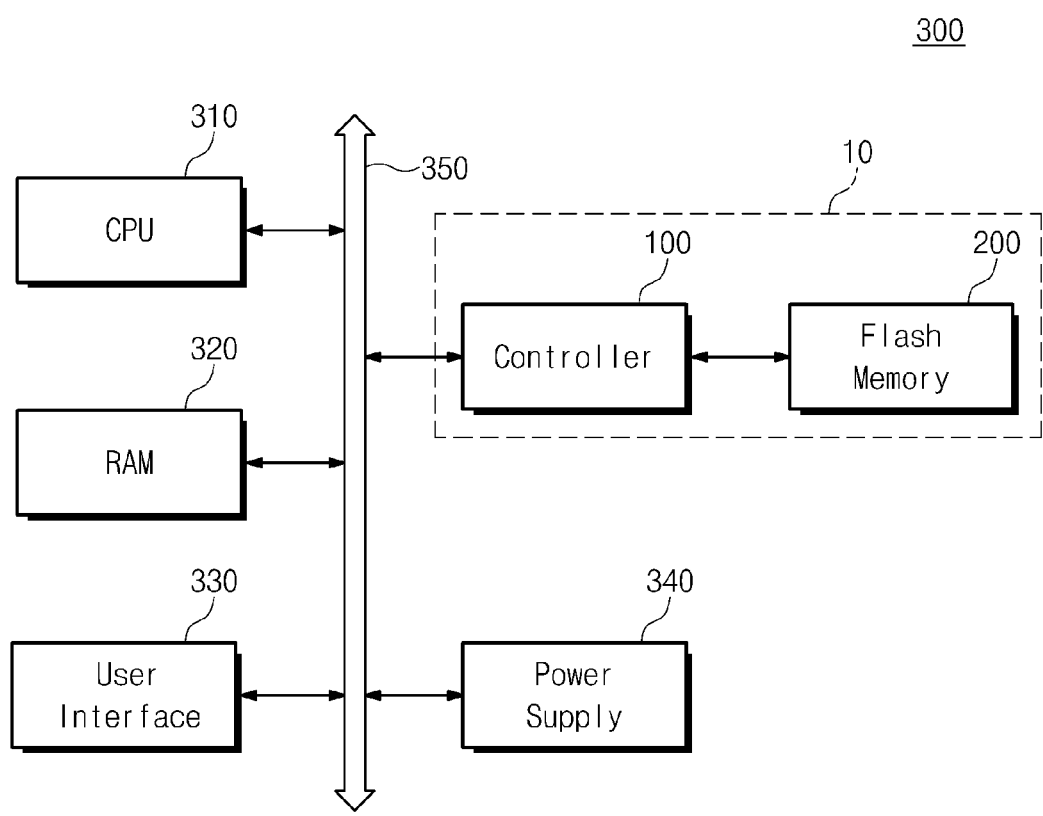
FIG. 21 is a block diagram illustrating a computational system according to an embodiment of the inventive concept which includes the memory system of FIG. 1.

FIG. 21 is a block diagram illustrating a computation system 300 according to an embodiment of the inventive concept which includes the memory system 10 of FIG. 1.

Referring to FIG. 21, the computational system 300 comprises a central processing unit (CPU) 310, a RAM 320, a user interface 330, a power supply source 340, and the memory system 10.

The memory system 10 is electrically connected to the CPU 310, the RAM 320, the user interface 330 and the power supply source 340 through a system bus 350. Data that are provided through the user interface 330 or processed by the CPU 310 are stored in the memory system 10. The memory system 10 includes the controller 200 and the flash memory device 200.

When the memory system 10 is mounted as a semiconductor disk device (SSD), the booting speed of the computational system 300 can be markedly increased. Although not shown, it is apparent to those skilled in the art that the computational system 300 may further comprise an application chipset and a camera image processor.

The flash memory device according to embodiments of the inventive concept applies the first pass voltage to form the channel, and applies the local voltage to localize the channel. Furthermore, the flash memory device applies the second pass voltage to the selection channel that includes the channel region corresponding to the selection word line, thereby performing boosting.

Since the flash memory device applies the selection channel to the second pass voltage to perform boosting, the boosting efficiency of the flash memory device improves.

Moreover, although the first pass voltage is applied to the non-selection channel, since the second pass voltage is not applied to the non-selection channel, the flash memory device decreases stress that is caused by the pass voltage.

Since the non-selection channel is only boosted by the first pass voltage, the flash memory device prevents Gate Induced Drain Leakage (GIDL) between the non-selection channel and the memory cell to which the local voltage is applied.

The above-disclosed subject matter is to be considered illustrative and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A programming method for a flash memory device, the programming method comprising:
applying a first pass voltage to a selection word line and a non-selection word line;
applying a local voltage to the non-selection word line;
applying a second pass voltage to the selection word line; and
applying a programming voltage to the selection word line, wherein the local voltage is lower than the first pass voltage.

2. The programming method of claim 1, wherein applying the local voltage to the non-selection word line and applying the second pass voltage to the selection word line are performed at the same time.

3. The programming method of claim 1, wherein a level of the second pass voltage is higher than a level of the first pass voltage.

4. The programming method of claim 1, wherein applying the first pass voltage to the selection word line and the non-selection word line comprises applying the first pass voltage to a plurality of word lines between first and second selection lines.

5. The programming method of claim 4, wherein:
the selection word line is disposed between the non-selection word line and the second selection line, and
applying the second pass voltage to the selection word line comprises applying the second pass voltage to a plurality of word lines between the non-selection word line and the second selection line.

6. The programming method of claim 5, wherein the first pass voltage is applied to word lines between the non-selection word line and the first selection line, when the second pass voltage is applied to the selection word line.

7. The programming method of claim 1, wherein applying the first pass voltage to the selection word line and the non-selection word line comprises:
applying the first pass voltage to the selection word line, and a plurality of word lines between the selection word line and a first selection line; and
applying a ground voltage to a plurality of word lines between the selection word line and a second selection line.

8. The programming method of claim 7, wherein the non-selection word line is disposed between the first selection line and the selection word line, and
applying the second pass voltage to the selection word line comprises applying the second pass voltage to a plurality of word lines between the non-selection word line and the second selection line.

9. The programming method of claim 8, wherein the first pass voltage is applied to word lines between the non-selection word line and the first selection line, when the second pass voltage is applied to the selection word line.

10. The programming method of claim 7, wherein applying the first pass voltage to the selection word line and the word lines between the selection word line and the first selection line and applying the ground voltage to the word lines between the selection word line and the second selection line are performed at the same time.

11. The programming method of claim 7, wherein a plurality of memory cells which are connected to a first word line are programmed prior to a plurality of memory cells which are connected to a second word line which is disposed between the first word line and the second selection line.

12. The programming method of claim 1, wherein applying the first pass voltage to the selection word line and the non-selection word line comprises:
applying the first pass voltage to a plurality of word lines between the selection word line and a first selection line, the selection word line, and a word line group comprising at least one word line which is disposed between the selection word line and a second selection line and is adjacent to the selection word line; and
applying a ground voltage to a plurality of word lines between the word line group and the second selection line.

13. The programming method of claim 12, wherein the flash memory device stores a plurality of bits per memory cell, and
a plurality of memory cells connected to at least one word line of the word line group pre-store at least one bit per cell.

14. The programming method of claim 12, wherein:
the non-selection word line is disposed between the first selection line and the selection word line, and
applying the second pass voltage to the selection word line comprises applying the second pass voltage to a plurality of word lines between the non-selection word line and the second selection line.

15. The programming method of claim 12, wherein a least significant page of a first word line is programmed prior to a least significant page of a second word line which is disposed between the first word line and the second selection line.

16. The programming method of claim 15, wherein the least significant page of the second word line is programmed prior to a most significant page of the first word line.

17. A flash memory device, comprising:
a memory cell array;
a bias circuit configured to generate voltages applied to the memory cell array during a programming operation; and
a control logic configured to control operation of the bias circuit,
wherein the control logic is further configured to control application of a first pass voltage to a selection word line and non-selection word line of the memory cell array, application of a local voltage to the non-selection word line, application of a second pass voltage to the selection word line, and application of a programming voltage to the selection word line,
wherein the local voltage is lower than the first pass voltage.

18. A memory system, comprising:
a flash memory device, and a controller configured to control the overall operation of the flash memory device,
wherein the flash memory device comprises:
a bias circuit configured to generate voltages applied to the memory cell array during a programming operation; and
a control logic configured to control operation of the bias circuit,
wherein the control logic is further configured to control application of a first pass voltage to a selection word line and non-selection word line of the memory cell array, application of a local voltage to the non-selection word line, application of a second pass voltage to the selection word line, and application of a programming voltage to the selection word line, wherein the local voltage is lower than the first pass voltage.

19. The memory system of claim 18, wherein the flash memory device and the controller form a semiconductor disk/drive (SSD).

20. The memory system of claim 18, wherein the flash memory device and the controller form a memory card.

* * * * *